US008558232B2

(12) United States Patent
Nakatani et al.

(10) Patent No.: US 8,558,232 B2
(45) Date of Patent: Oct. 15, 2013

(54) THIN FILM TRANSISTOR AND METHOD FOR MANUFACTURING THE SAME

(75) Inventors: Yoshiki Nakatani, Osaka (JP); Masao Moriguchi, Osaka (JP); Yohsuke Kanzaki, Osaka (JP); Yudai Takanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/387,371

(22) PCT Filed: Apr. 21, 2010

(86) PCT No.: PCT/JP2010/057049
§ 371 (c)(1),
(2), (4) Date: Feb. 15, 2012

(87) PCT Pub. No.: WO2011/013417
PCT Pub. Date: Feb. 3, 2011

(65) Prior Publication Data
US 2012/0138931 A1    Jun. 7, 2012

(30) Foreign Application Priority Data

Jul. 30, 2009   (JP) .................................. 2009-177426

(51) Int. Cl.
*H01L 29/786* (2006.01)
(52) U.S. Cl.
USPC ............................................ 257/57; 438/151
(58) Field of Classification Search
USPC .............. 257/57, E29.273, E21.411; 438/151
See application file for complete search history.

(56) References Cited

U.S. PATENT DOCUMENTS

| 5,834,345 | A | 11/1998 | Shimizu |
| 2004/0126941 | A1 | 7/2004 | Yukawa |
| 2011/0278583 | A1* | 11/2011 | Hayashi et al. ................. 257/72 |
| 2012/0001178 | A1* | 1/2012 | Miyairi et al. .................. 257/53 |
| 2012/0094446 | A1* | 4/2012 | Yamazaki et al. ............ 438/158 |
| 2013/0026574 | A1* | 1/2013 | Nakanishi et al. ............ 257/347 |
| 2013/0105802 | A1* | 5/2013 | Harumoto et al. .............. 257/59 |

FOREIGN PATENT DOCUMENTS

| EP | 0 473 988 A1 | 3/1992 |
| JP | 06-342909 A | 12/1994 |
| JP | 07-321325 A | 12/1995 |
| JP | 09-092841 A | 4/1997 |
| JP | 2002-343970 A | 11/2002 |
| JP | 2004-055735 A | 2/2004 |

OTHER PUBLICATIONS

Official Communication issued in International Patent Application No. PCT/JP2010/057049, mailed on Jul. 13, 2010.

* cited by examiner

*Primary Examiner* — Thao P. Le
(74) *Attorney, Agent, or Firm* — Keating & Bennett, LLP

(57) ABSTRACT

The present invention aims at reducing an OFF current in a thin film transistor while maintaining an ON-state current.
A TFT (100) includes a glass substrate (101) formed thereon with a source electrode (110) and a drain electrode (112) having their respective upper surfaces formed with n-type silicon layers (120, 121) of microcrystalline silicon. Microcrystalline silicon regions (135, 136) are formed respectively on the n-type silicon layers (120, 121) while an amorphous silicon region (130) is formed on the glass substrate (101), and these are covered by a microcrystalline silicon layer (145). Therefore, ON-state current flows from the drain electrode (112), through the microcrystalline silicon region (135), the microcrystalline silicon layer (145) and the microcrystalline silicon region (136) in this order, and then to the source electrode (110). Also, OFF current is limited by the amorphous silicon region (130).

7 Claims, 19 Drawing Sheets

(A)

(B)

(C)

(A)

(B)

(A)

(B)

(C)

(D)

(A)

(B)

(C)

(A)

(B)

(C)

(D)

(E)

(F)

(A)

(B)

(C)

(D)

(E)

(F)

(A)

(B)

(C)

(D)

(E)

(F)

THIN FILM TRANSISTOR AND METHOD FOR MANUFACTURING THE SAME

TECHNICAL FIELD

The present invention relates to a thin film transistor and a method for manufacturing the same. More specifically, the present invention relates to a thin film transistor suitable for switching elements in pixel formation portions on a display panel or constituent elements of a drive circuit thereof, and to a method for manufacturing the thin film transistor.

BACKGROUND ART

In conventional active matrix liquid crystal display devices, thin film transistors (hereinafter called "TFT") are utilized as switching elements in pixel formation portions. In recent years, however, TFT has been used not only as switching elements in pixel formation portions but also as elements for drive circuits, even in liquid crystal display devices manufactured from large substrates of newer generations including the sixth generation substrates, in an effort to reduce the manufacturing cost. In this trend, development has been made for changing the TFT's channel layers from conventional amorphous silicon layers to microcrystalline silicon layers for improved characteristics.

However, the TFT utilizing microcrystalline silicon layers as its channel layer has a problem that when the TFT is turned OFF, a current which flows between the source electrode and the drain electrode (hereinafter called "Off-state current") is greater than in those TFTs utilizing amorphous silicon layers as their channel layers. In an attempt to solve this, Japanese Laid-Open Patent Publication No. 9-92841 discloses a bottom-gate TFT which makes use of a stacked film constituted by an amorphous silicon layer and a microcrystalline silicon layer as a channel layer.

FIG. 20 is a sectional view showing a configuration of a conventional bottom-gate TFT 600 disclosed in Japanese Laid-Open Patent Publication No. 9-92841, in which a microcrystalline silicon layer 645 and an amorphous silicon layer 630 form a stacked film serving as a channel layer 640. As shown in FIG. 20, the TFT 600 has a glass substrate 601, on which a gate electrode 660 is formed, and the entire glass substrate 601 including the gate electrode 660 is covered by a gate insulation film 650. The microcrystalline silicon layer 645 is formed on the gate insulation film 650. The amorphous silicon layer 630 is formed on the microcrystalline silicon layer 645. The microcrystalline silicon layer 645 and the amorphous silicon layer 630 constitute a stacked film which serves as a channel layer 640 of the TFT 600. A left and a right ends of the amorphous silicon layer 630 are respectively formed with ohmic contact layers 620, 621 doped with high concentration n-type impurities, and on these ohmic contact layers 620, 621, a source electrode 610 and a drain electrode 612 are formed respectively. Further, the entire TFT 600 is covered by a protective layer 670.

PRIOR ART DOCUMENTS

Patent Documents

[Patent Document 1] Japanese Laid-Open Patent Publication No. 9-92841

SUMMARY OF THE INVENTION

Problems to be Solved by the Invention

However, the TFT 600 according to Japanese Laid-Open Patent Publication No. 9-92841 has following problems: As shown in FIG. 20, when the TFT 600 is in ON state, an electric current flows from the drain electrode 612 through the ohmic contact layer 621, the amorphous silicon layer 630, the microcrystalline silicon layer 645, the amorphous silicon layer 630, and the ohmic contact layer 620 in this order, to the source electrode 610. In this case, the current passes through the high-resistant amorphous silicon layer 630 before and after passing through the microcrystalline silicon layer 645. This causes a problem that when the TFT 600 is in ON state, a current which flows between the source electrode 610 and the drain electrode 612 (hereinafter called "ON-state current") is small.

It is therefore an objet of the present invention to provide a thin film transistor which has substantially the same level of ON-state current and a lower OFF-state current compared to cases where the channel layer is constituted only by a microcrystalline semiconductor layer.

Means for Solving the Problems

A first aspect of the present invention provides a top-gate thin film transistor formed on an insulated substrate, which includes:
    a source electrode and a drain electrode;
    a first and a second impurity-doped semiconductor layers containing one of a first and a second electrically conductive impurities, and electrically connected to the source electrode and drain electrode respectively;
    a first semiconductor layer including microcrystalline semiconductor regions formed on the first and the second impurity-doped semiconductor layers respectively, and an amorphous semiconductor region formed on an area not formed with the microcrystalline semiconductor regions;
    a second semiconductor layer of a microcrystalline semiconductor formed on the first semiconductor layer; and
    a gate insulation film formed on the second semiconductor layer:
    With the above arrangement, the first and the second impurity-doped semiconductor layers are provided by a microcrystalline semiconductor and are electrically connected to the second semiconductor layer, with the microcrystalline semiconductor region of the first semiconductor layer sandwiched therebetween.

A second aspect of the present invention provides the thin film transistor according to the first aspect of the present invention. In this transistor,
    the source electrode and the drain electrode are formed on the insulated substrate,
    the first and the second impurity-doped semiconductor layers are formed on upper surfaces of the source electrode and the drain electrode respectively,
    the amorphous semiconductor region is formed on an area of the insulated substrate between the source electrode and the drain electrode, as well as on side surfaces of the source electrode and of the drain electrode, and
    the microcrystalline semiconductor regions are formed on the first and the second impurity-doped semiconductor layers respectively.

A third aspect of the present invention provides the thin film transistor according to the first aspect of the present invention. In this transistor,
    the first and the second impurity-doped semiconductor layers are spaced from each other by a predetermined distance on the insulated substrate,
    the source electrode and the drain electrode are formed on the first and the second impurity-doped semiconductor layers respectively, leaving mutually opposed end portions of the first and the second impurity-doped semiconductor layers exposed, the amorphous semiconductor region is formed on an area of the insulated substrate between the first and the second impurity-doped semiconductor layers, as well as on the source electrode and the drain electrode, and the microcrystalline semiconductor regions are formed on exposed areas of the first and the second impurity-doped semiconductor layers exposed from the source electrode and the drain electrode respectively.

A fourth aspect of the present invention provides the thin film transistor according to the first aspect of the present invention. In this transistor, the source electrode and the drain electrode are formed on the insulated substrate, the first and the second impurity-doped semiconductor layers cover side surfaces and at least part of upper surfaces of the source electrode and the drain electrode, the amorphous semiconductor region is formed on an area of the insulated substrate between the first and the second impurity-doped semiconductor layers, and a microcrystalline semiconductor regions are formed on the first and on the second impurity-doped semiconductor layers respectively.

A fifth aspect of the present invention provides the thin film transistor according to the first aspect of the present invention. In this transistor, at least side surfaces of the first semiconductor layer and of the second semiconductor layer are covered by an oxidized semiconductor film.

A sixth aspect of the present invention provides a method for manufacturing a top-gate thin film transistor. The method includes:

a step of forming a source electrode and a drain electrode on an insulated substrate;

a step of forming a first and a second impurity-doped semiconductor layers containing one of a first and a second electrically conductive impurities and electrically connected to the source electrode and drain electrode respectively;

a step of forming a first semiconductor layer including microcrystalline semiconductor regions and an amorphous semiconductor region covering at least the first and the second impurity-doped semiconductor layers;

a step of forming a second semiconductor layer of a microcrystalline semiconductor on the first semiconductor layer; and a step of forming a gate insulation film on the second semiconductor layer.

With the above arrangement, the step of forming the first semiconductor layer includes:

a process of growing a microcrystalline semiconductor region having the same crystal structure as of the first and the second impurity-doped semiconductor layers on each of the first and the second impurity-doped semiconductor layers; and growing an amorphous semiconductor region on the source electrode and on the drain electrode.

A seventh aspect of the present invention provides the method for manufacturing the thin film transistor according to the sixth aspect of the present invention. The method further includes:

a step of consecutively etching at least the gate insulation film and the first and the second semiconductor layers; and a step of oxidizing etched side surfaces of the first and the second semiconductor layers after the etching of the first semiconductor layer.

Advantages of the Invention

According to the first aspect of the present invention, the first and the second impurity-doped semiconductor layers made of microcrystalline semiconductor are electrically connected to the source electrode and the drain electrode respectively, and electrically connected to the microcrystalline semiconductor regions of the first semiconductor layer formed on the source electrode and the drain electrode respectively. Further, the microcrystalline semiconductor regions are electrically connected to the second semiconductor layer which is made of microcrystalline semiconductor. According to the arrangement, the source electrode and the drain electrode are electrically connected with each other by high-mobility microcrystalline semiconductors in the first and the second impurity-doped semiconductor layers, the microcrystalline semiconductor regions in the first semiconductor layer, and the second semiconductor layer. Therefore, the thin film transistor has a large ON-state current. Also, the arrangement reduces OFF current because a low-mobility, amorphous semiconductor region is formed on a side of the second semiconductor layer which faces away from the gate electrode. Further, since the gate insulation film is formed on the second semiconductor layer, the second semiconductor layer has an increased crystal grain size with an increased crystallization rate near its boundary surface between the gate insulation film and the second semiconductor layer where the ON-state current flows. Therefore, ON-state current which flows here is greater.

According to the second aspect of the present invention, the source electrode and the drain electrode have their upper surfaces formed with the first and the second impurity-doped semiconductor layers whereas the first and the second impurity-doped semiconductor layers have their upper surfaces formed with the microcrystalline semiconductor regions. This means that the electrical connection between the source electrode and the drain electrode is provided solely by microcrystalline semiconductor layers and regions. Hence, the thin film transistor has a large ON-state current. Also, the arrangement decreases OFF current in the thin film transistor since an amorphous semiconductor region is formed on an area on the insulated substrate between the source electrode and the drain electrode.

According to the third aspect of the present invention, the source electrode and the drain electrode are formed on the first and the second impurity-doped semiconductor layers, leaving mutually opposed end portions of the first and the second impurity-doped semiconductor layers exposed. The microcrystalline semiconductor regions are formed on exposed areas on the first and the second impurity-doped semiconductor layers. This means that the electrical connection between the source electrode and the drain electrode is provided solely by microcrystalline semiconductor layers and regions. Hence, the thin film transistor has a large ON-state current. Also, the arrangement decreases OFF current in the thin film transistor since an amorphous semiconductor region is formed on an area on the insulated substrate between the source electrode and the drain electrode.

According to the fourth aspect of the present invention, the source electrode and the drain electrode have their side surfaces and part of upper surfaces covered by the first and the second impurity-doped semiconductor layers whereas the first and the second impurity-doped semiconductor layers have their upper surfaces formed with the microcrystalline semiconductor regions. This means that the electrical connection between the source electrode and the drain electrode is provided solely by microcrystalline semiconductor layers and regions. Hence, the thin film transistor has a large ON-state current. Also, the arrangement decreases OFF current in the thin film transistor since an amorphous semiconductor region is formed on an area on the insulated substrate between the source electrode and the drain electrode. According to the fifth aspect of the present invention, at least side surfaces of the first semiconductor layer and of the second semiconductor layer are formed with an oxidized semiconductor film. The arrangement prevents a leakage current from the source electrode or the drain electrode which would otherwise flow through the side surfaces of the gate insulation film to the gate electrode.

According to the sixth aspect of the present invention, it is possible to form microcrystalline semiconductor regions which have the same crystal structures as of the first and the second impurity-doped semiconductor layers, respectively on the first and the second impurity-doped semiconductor layers, and to form simultaneously therewith, amorphous semiconductor regions on the source electrode and the drain electrode. The arrangement provides an easy method for manufacturing a thin film transistor which has a large ON-state current and a small OFF current. Also, since the gate insulation film is formed on the second semiconductor layer, the second semiconductor layer has an increased crystal grain size with an increased crystallization rate near its boundary surface between the gate insulation film and the second semiconductor layer where the ON-state current flows. Therefore, it is now possible to manufacture a thin film transistor which has a greater ON-state current.

According to the seventh aspect of the present invention, after consecutive etching of at least the gate insulation film and the first and the second semiconductor layers, at least side surfaces of the first and the second semiconductor layers formed by the etching are oxidized to form an oxidized semiconductor film. The arrangement prevents a leakage current from the source electrode or the drain electrode which would otherwise flow through the side surfaces of the gate insulation film to the gate electrode.

MODE FOR CARRYING OUT THE INVENTION

1. Basic Discussion

<1.1 Crystal Structure of Amorphous Silicon Film on Microcrystalline Silicon Film>

A crystal structure of an amorphous silicon film deposited on a microcrystalline silicon film will be discussed. FIG. 1(A) is a sectional view of an amorphous silicon film 15 deposited on a glass substrate 10; FIG. 1(B) is a sectional view of a microcrystalline silicon film 20 deposited on a glass substrate 10; and FIG. 1(C) is a sectional view of a stacked film composed of a microcrystalline silicon film 20 and an amorphous silicon film 25 deposited on a glass substrate 10.

Figure 1:
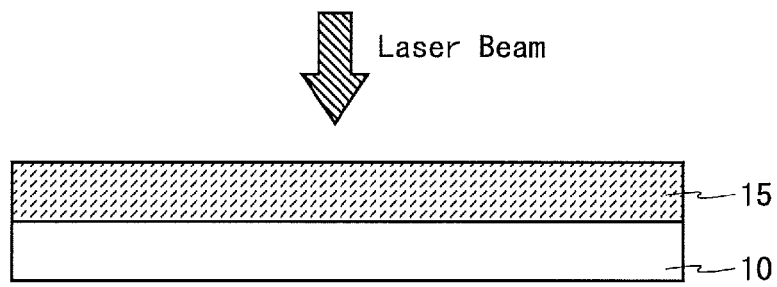
FIG. 1(A) is a sectional view of an amorphous silicon film deposited on a glass substrate.
FIG. 1(B) is a sectional view of a microcrystalline silicon film deposited on a glass substrate.
FIG. 1(C) is a sectional view of a stacked film composed of a microcrystalline silicon film and an amorphous silicon film deposited on a glass substrate.
Figure 1:
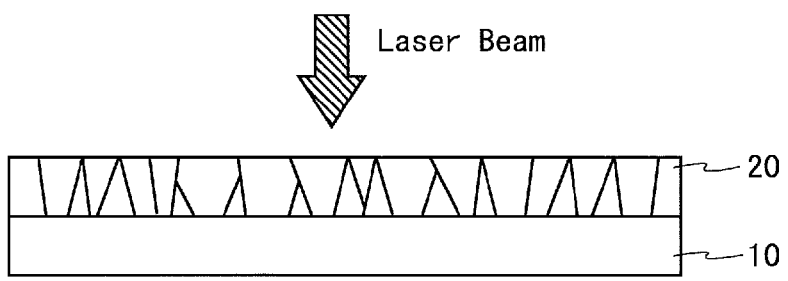
Figure 1:
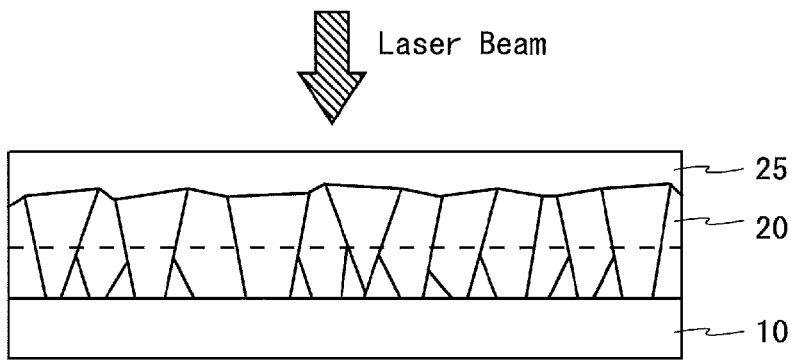
Figure 2:
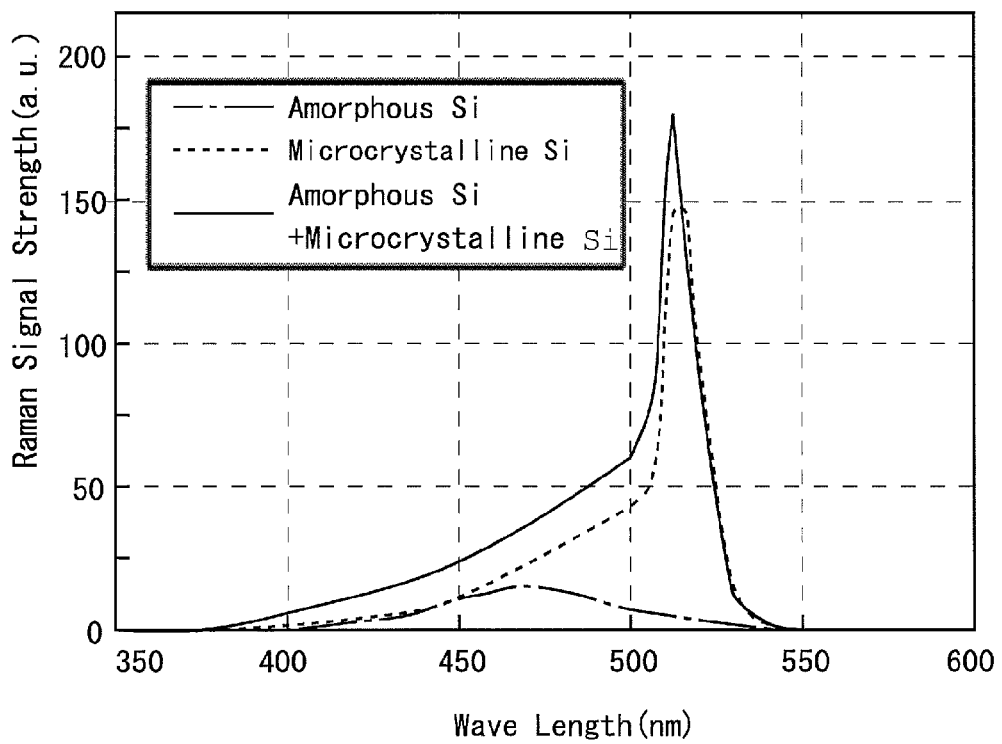
FIG. 2 shows a result of Raman spectroscopy measurements of the silicon films in FIG. 1(A) through FIG. 1(C).

FIG. 2 shows a result of Raman spectroscopy measurements of the silicon films in FIG. 1(A) through FIG. 1(C). More specifically, FIG. 2 is a graph obtained by irradiating each of the thin films in FIG. 1(A) through FIG. 1(C) with a single-wavelength laser beam from an upper surface side (top side in FIG. 1) of the glass substrate 10 and then analyzing scattered laser beam spectra. As shown in FIG. 2, Raman signals from the amorphous silicon film 15, in FIG. 1(A), deposited on the glass substrate 10 gives a gentle curve having a peak around a 480-nm wavelength. In contrast, the microcrystalline silicon film 20, FIG. 1(B), deposited on the glass substrate 10 contains crystal components and therefore Raman signals give a curve which has an acute peak around a 520-nm wavelength.

It was expected that Raman signals from the stacked film in FIG. 1(C) which was formed on the glass substrate 10 by stacking the microcrystalline silicon film 20 and the amorphous silicon film 25 in this order, would give a hybrid shape between the Raman signals from the microcrystalline silicon film 20 and the Raman signals from the amorphous silicon film 25, or would give a curve which has a lower acute peak around the 520-nm wavelength than in the case shown in FIG. 1(B) where only a microcrystalline silicon film 20 was deposited, because detection of the Raman signals were performed from the side closer to the amorphous silicon film 25.

However, as shown in FIG. 2, the Raman signals gave a higher acute peak around the 520-nm wavelength than in the case of a single layer film provided by the microcrystalline silicon film 20. This could be understood that part of the silicon film which was intended to be the amorphous silicon film 25 on the microcrystalline silicon film 20 reproduced the crystal structure of the underlying microcrystalline silicon film 20 and became the microcrystalline silicon film 20. In more specific words, the microcrystalline silicon film 20 was originally intended to be deposited up to the height indicated by broken line in FIG. 1(C) whereas the amorphous silicon film 25 was intended to be at and above the height indicated by the broken line. However, at the time of deposition, part of the silicon film which was intended to be deposited as the amorphous silicon film 25 on the microcrystalline silicon film 20 reproduced the crystal structure of the underlying microcrystalline silicon film 20 and grew as a microcrystalline silicon film 20. It is understood that the above-described process leads to the deposition of the microcrystalline silicon film 20 to a level higher than the broken line.

In FIG. 1(C), the amorphous silicon film 25 formed on the microcrystalline silicon film 20 is thicker than amorphous silicon films to be described later when describing steps in methods for manufacturing each of the embodiments. Because of the greater thickness, a portion of the amorphous silicon film 25 near surface could not reproduce the crystal structure of the underlying microcrystalline silicon film 20 to become the microcrystalline silicon film 20, and therefore remains as the amorphous silicon film 25. On the contrary, in each embodiment to be described later, the amorphous silicon film 25 formed on the microcrystalline silicon film 20 is so intended that it becomes the microcrystalline silicon film 20 up to the top surface thereof.

It should be noted here that the term microcrystalline semiconductor as used in this DESCRIPTION refers to those which give a Raman spectroscopic response that a ratio of pure crystalline phase to amorphous phase indicated by Raman signal peak strength is in a range of approximately 2 through 20. More specifically, in the microcrystalline silicon, a ratio of a Raman signal strength at a 520 $cm^{-1}$ to a Raman signal strength at a 480 $cm^{-1}$ fall in a range of approximately 2 through 20.

<1.2 Crystal Structure of Microcrystalline Silicon Film>

Next, description will cover how crystalline state changes in the microcrystalline silicon film in its thickness direction. While a microcrystalline silicon film is being deposited on a gate insulation film, first, an incubation layer grows on a boundary surface between the newly forming film and the gate insulation film. The incubation layer is a precursor until the microcrystalline silicon film grows, and it has a large number of voids within the layer. A microcrystalline silicon film which contains such an incubation layer cannot form a good boundary surface between the gate insulation film and the microcrystalline silicon film, and therefore has a low mobility. It is therefore preferable that the microcrystalline silicon film does not include the incubation layer substantially. The expression "not to include an incubation layer substantially" refers to a state that a thickness of the incubation layer included in the microcrystalline silicon film is not greater than 5 nm. Forming the microcrystalline silicon film which does not include an incubation layer substantially improves a boundary surface characteristics between the microcrystalline silicon film and the gate insulation film, and increases mobility in the microcrystalline silicon film.

Figure 3:
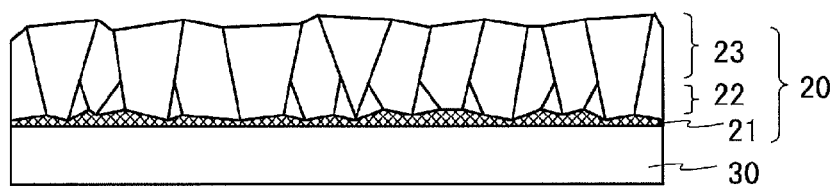
FIG. 3 is a sectional view showing a crystalline state in a thickness direction, in a microcrystalline silicon film formed on a gate insulation film.

FIG. 3 is a sectional view showing a crystalline state in the thickness direction, in a microcrystalline silicon film 20 deposited on a gate insulation film 30. As shown in the figure, in the process of forming the microcrystalline silicon film 20 on the gate insulation film 30, first, an incubation layer 21 grows at the boundary surface, then an initial microcrystalline layer 22 grows, and then a microcrystalline layer 23 grows in this sequence on the incubation layer 21. The initial microcrystalline layer 22 is a crystalline layer having a low crystallization rate and small crystal grain size. The microcrystalline layer 23 is a crystalline layer having a greater crystallization rate and greater crystal grain size than the initial microcrystalline layer 22. The microcrystalline silicon film 20 contains the incubation layer 21, the initial microcrystalline layer 22 and the microcrystalline layer 23 as described above.

Figure 20:
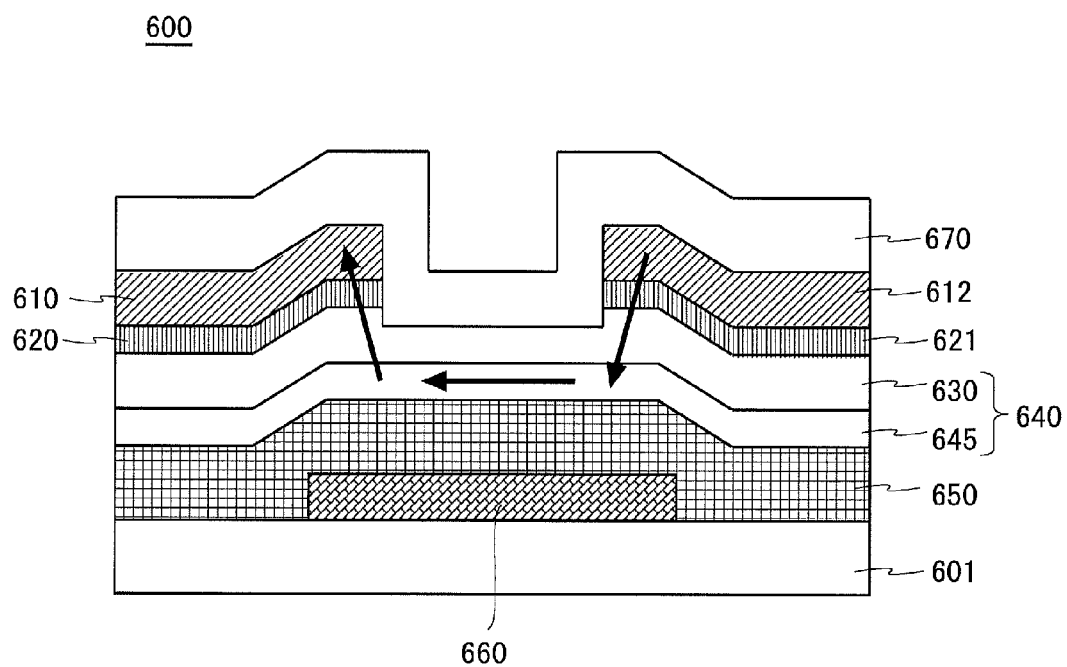
FIG. 20 is a sectional view showing a configuration of a conventional bottom-gate TFT.

Now, discussion will be made for a relationship between ON-state current and crystalline state in a microcrystalline silicon layer. First, discussion will be made for the TFT 600 in FIG. 20 described earlier in the Background Art. Since the TFT 600 is a bottom-gate TFT, its gate insulation film 650 is formed on the gate electrode 660, and the microcrystalline silicon layer 645 is formed on the gate insulation film 650. Thus, the microcrystalline silicon layer 645 has its side which is closer to the gate insulation film 650, formed with an incubation layer and an initial microcrystalline layer in this order, which have low crystallization rates and small crystal grains. In this case, ON-state current is small because it flows through the incubation layer and the initial microcrystalline layer in the microcrystalline silicon layer 645.

Next, a top-gate TFT will be discussed. In a top-gate TFT, a microcrystalline silicon layer is formed on an amorphous silicon layer, and a gate insulation film is formed on the microcrystalline silicon layer. Thus, the microcrystalline silicon layer has its side which is closer to the gate insulation film, formed with microcrystalline layer which has a high crystallization rate and large crystal grains. In this case, ON-state current is large because it flows through the microcrystalline layer in the microcrystalline silicon layer.

As understood, ON-state current in a top-gate TFT is greater than ON-state current in a bottom-gate TFT if the TFT has a channel layer containing an amorphous silicon layer and a microcrystalline silicon layer. Therefore, top-gate TFTs will be the subject of discussion in each embodiment to be described later.

In the present DESCRIPTION, the term incubation layer refers to a layer which gives a 75% or greater area ratio of a peak around a 2000 $cm^{-1}$ caused by Si—H to a peak around a 2100 $cm^{-1}$ caused by Si—$H_2$ and (Si—$H_2$)$_n$ in measurements by Fourier Transform Infrared Spectroscopy (FTIR). Also, the term amorphous silicon layer refers to a layer which gives a 75% or greater area ratio of the peak around the 2100 $cm^{-1}$ caused by Si—$H_2$ and (Si—$H_2$)$_n$ to the peak around the 2000 $cm^{-1}$ caused by Si—H in measurements by FT-IR.

2. First Embodiment

<2.1 Configuration of TFT>

Figure 4:
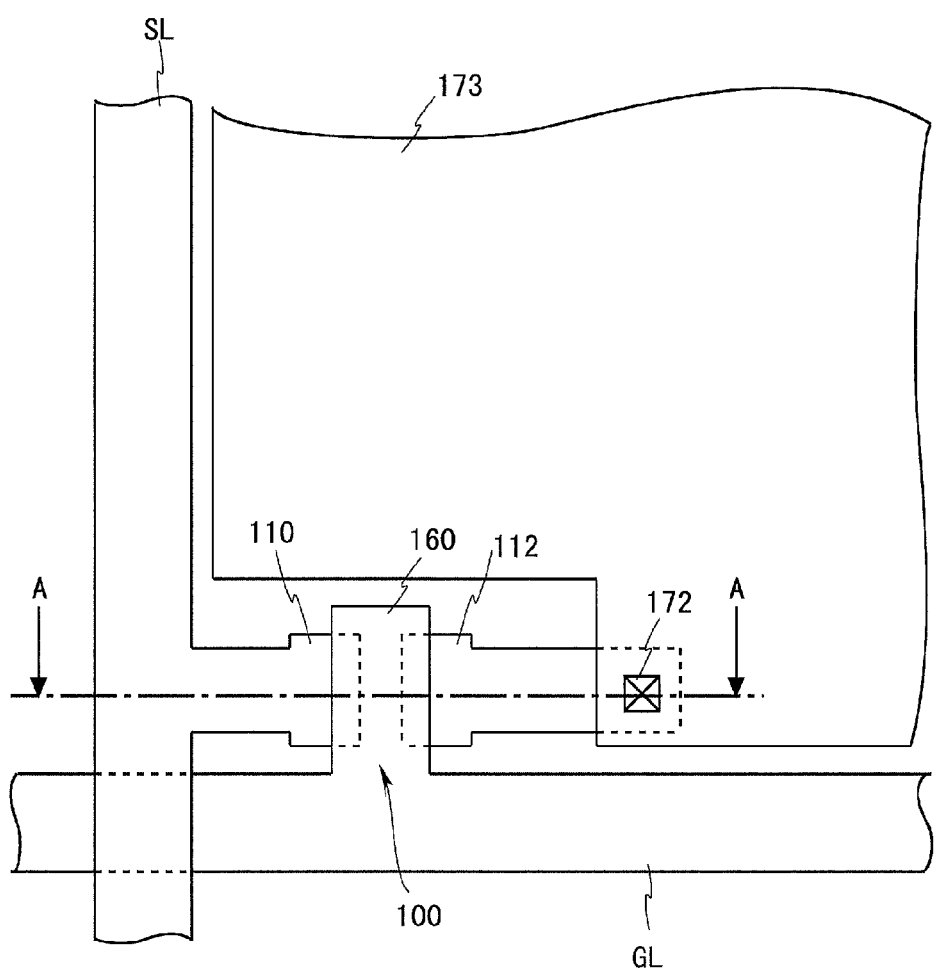
FIG. 4 is an enlarged plan view showing part of a liquid crystal panel included in a liquid crystal display device.

A liquid crystal display device includes a liquid crystal panel, which is formed with a plurality of image signal lines SL; a plurality of scanning signal lines GL crossing vertically thereto; and a plurality of pixel formation portions each at one of intersections made by these lines. FIG. 4 is an enlarged plan view showing part of such a liquid crystal panel. At each pixel formation portion, there is formed an n-channel TFT 100 which has its gate electrode 160 connected to one of the scanning signal lines GL that passes through a corresponding one of the intersections, and has its source electrode 110 connected to one of the image signal lines SL that passes through the corresponding intersection. There is also formed a pixel electrode 173 which is connected to a drain electrode 112 of the TFT 100 via a contact hole 172.

Figure 5:
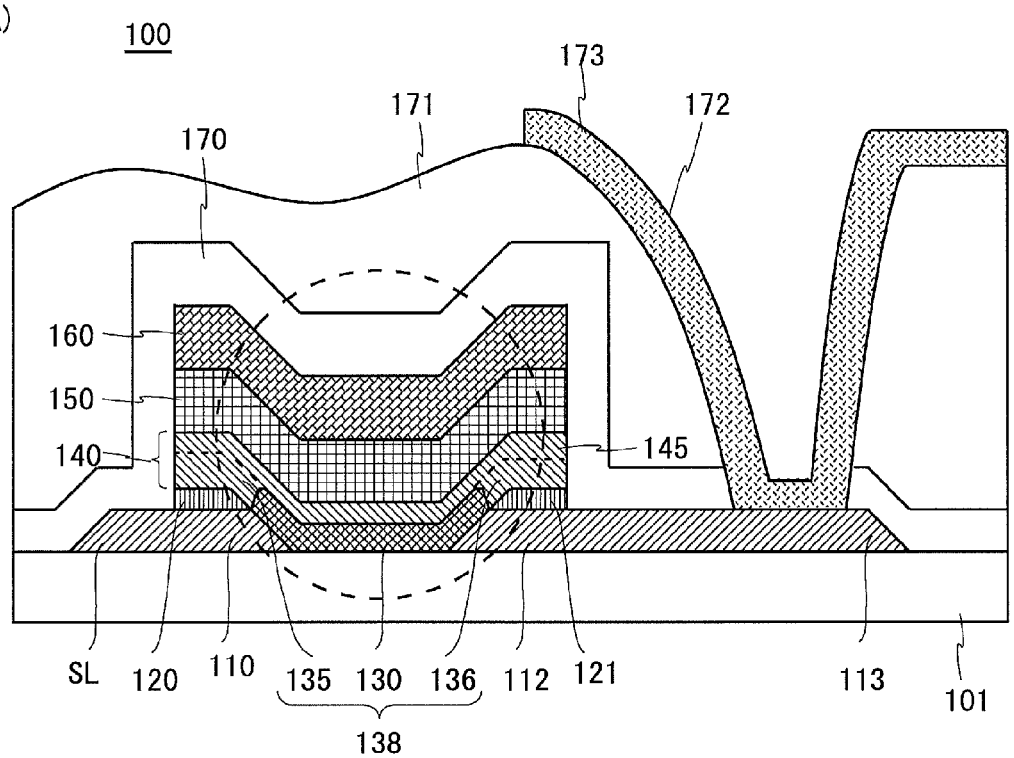
FIG. 5(A) is a sectional view showing a configuration of a TFT according to a first embodiment.
FIG. 5(B) is a fragmentary enlarged sectional view of the TFT in FIG. 5(A).
Figure 5:
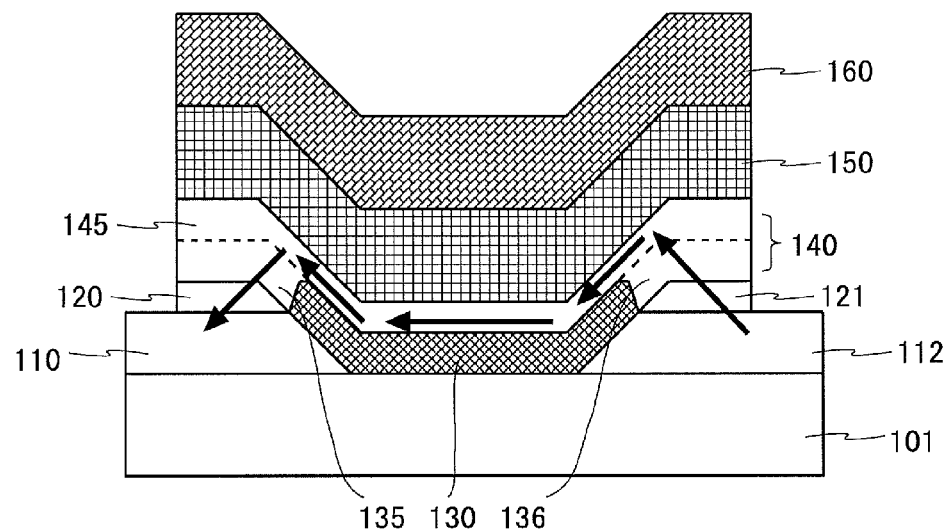

FIG. 5(A) is a sectional view showing a configuration of the TFT 100 according to the first embodiment of the present invention whereas FIG. 5(B) is a fragmentary enlarged sectional view of the TFT shown in FIG. 5(A). FIG. 5(A) and FIG. 5(B) show a section of the TFT 100 taken in a line A-A in FIG. 4. As shown in FIG. 5(A), two conductive layers are disposed at a predetermined distance on a glass substrate 101 which serves as an insulated substrate. One of the conductive layers has a portion which has a taper-shaped side surface and serves as a source electrode 110 and another portion which has a taper-shaped side surface and serves as an image signal line SL (sometimes these are collectively called "source electrode 110"). The other conductive layer has a portion which has a taper-shaped side surface and serves as a drain electrode 112 and another portion which has a taper-shaped side surface and serves as a drain electrode connection wire 113 (sometimes these are collectively called "drain electrode 112"). The source electrode 110 and the drain electrode 112 have their upper surfaces respectively formed with silicon layers of microcrystalline silicon containing n-type impurities such as phosphorus (P) (hereinafter called "n-type silicon layers" or "impurity-doped semiconductor layers") 120, 121.

An amorphous silicon region 130 is formed in a space on an area of the glass substrate 101 located between the source electrode 110 and the drain electrode 112 and flanked by the taper-shaped side surfaces of the source electrode 110 and of the drain electrode 112. Also, on the n-type silicon layers 120, 121, microcrystalline silicon regions 135, 136 are formed respectively. These amorphous silicon region 130 and microcrystalline silicon regions 135, 136 will be called silicon layer 138 (or "first semiconductor layer"). Further, on the silicon layer 138, a microcrystalline silicon layer 145 (also called "the second semiconductor layer") is formed. The stacked film composed of the silicon layer 138 and the microcrystalline silicon layer 145 serves as a channel layer 140 of the TFT 100.

A gate insulation film 150 is formed on the microcrystalline silicon layer 145. A gate electrode 160 is formed on the gate insulation film 150. The channel layer 140, the gate insulation film 150 and the gate electrode 160 have their relevant side surfaces flush with each other. Next, the entire TFT 100 is covered by a protective film 170 and a planarization film 171. The Planarization film 171 is formed with a contact hole 172 which reaches the drain electrode connection wire 113. On the planarization film 171, a pixel electrode 173 is formed which is connected to the drain electrode connection wire 113 via the contact hole 172.

As shown in FIG. 5(B), the source electrode 110 is electrically connected to the microcrystalline silicon region 135, with the n-type silicon layer 120 sandwiched in between whereas the drain electrode 112 is electrically connected to the microcrystalline silicon region 136, with the n-type silicon layer 121 sandwiched in between. Therefore, as indicated by arrows in FIG. 5(B), ON-state current in the TFT 100 flows through the drain electrode 112, the n-type silicon layer 121, the microcrystalline silicon region 136, the microcrystalline silicon layer 145, the microcrystalline silicon region 135, and the n-type silicon layer 120 in this order, and then to the source electrode 110. As understood from the above, unlike in the TFT 600, ON-state current in the TFT 100 is large because it flows from the drain electrode 112 to the source electrode 110 without passing through a high resistance amorphous silicon layer. The channel layer 140 has its back gate side (the side closer to the glass substrate 101) formed with the amorphous silicon region 130, and therefore OFF current is small.

<2.2 Method for Manufacturing TFT>

Figure 6:
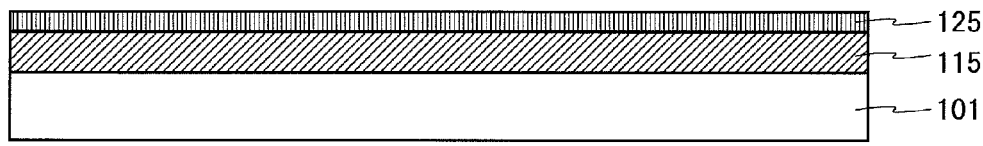
FIGS. 6(A) through (D) are sectional views showing steps in a method for manufacturing the TFT in FIG. 5(A).
Figure 6:
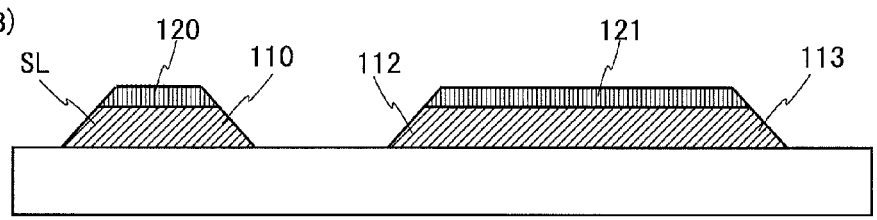
Figure 6:
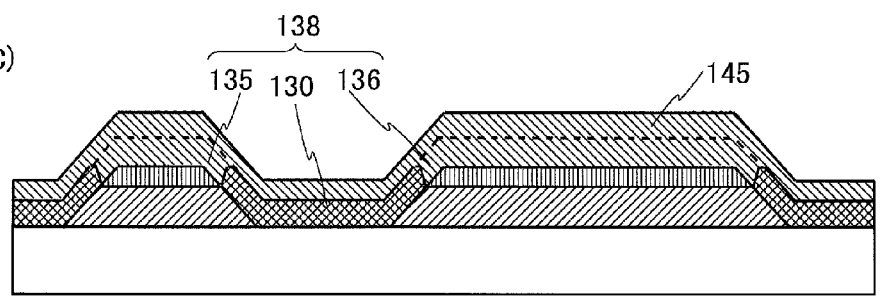
Figure 6:
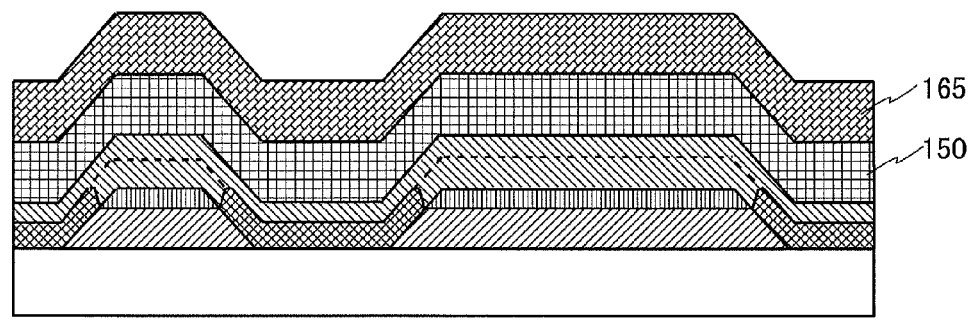
Figure 7:
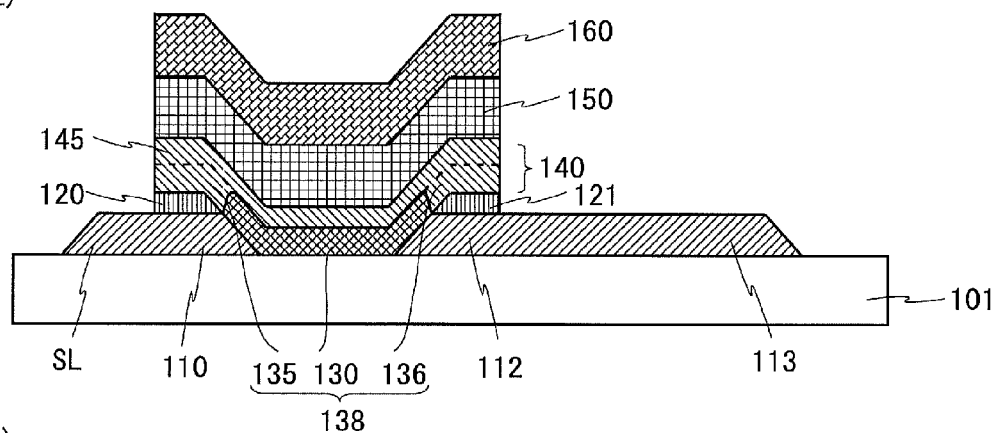
FIGS. 7(E) through (G) are sectional views showing steps in the method for manufacturing the TFT in FIG. 5(A).
Figure 7:
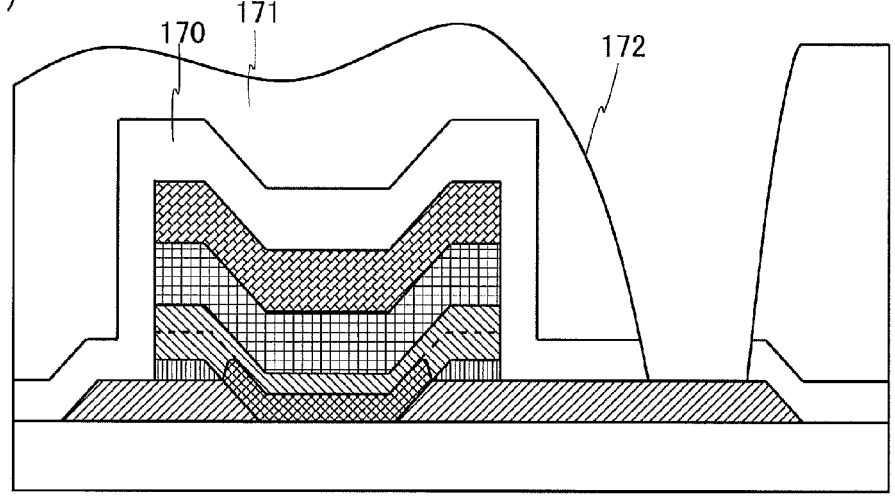
Figure 7:
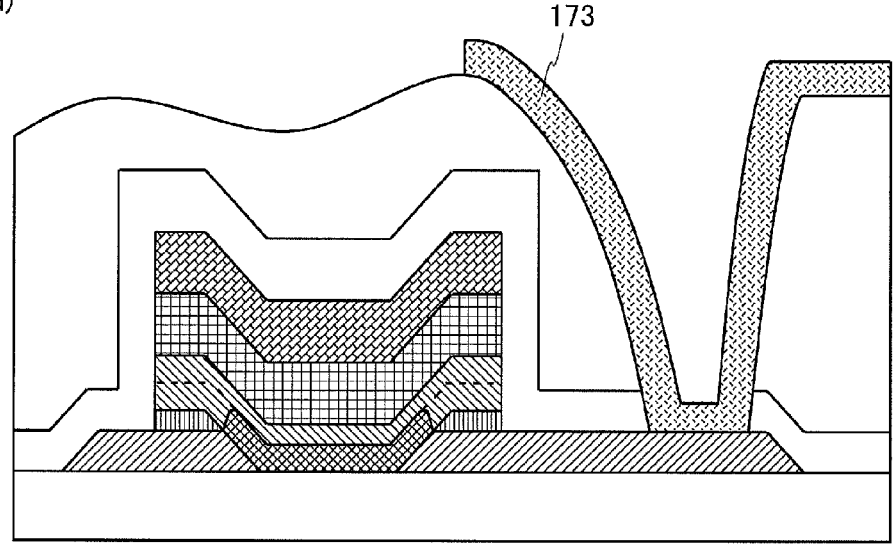

FIG. 6 and FIG. 7 are sectional views which show steps in a method for manufacturing the TFT 100 in FIG. 5(A). As shown in FIG. 6(A), a metal film 115 of aluminum for example, is deposited on an entire surface of a glass substrate 101 by sputtering. Next, by using a capacitance coupling CVD (Chemical Vapor Deposition) apparatus, a microcrystalline silicon film (hereinafter called "n-type silicon film") 125 doped with high concentration n-type impurities such as phosphorus is deposited. A preferred range of film thickness for the n-type silicon film 125 is 40 through 80 nm. In the present embodiment, the thickness is 60 nm. It should be noted here that the n-type silicon film 125 was given a large thickness in order to form the microcrystalline layer thicker than the incubation layer and the initial microcrystalline layer.

Deposition conditions for the n-type silicon film 125 are detailed here: For the deposition, it is preferable that the pressure setting for the chamber should be within a range of $1.00 \times 10^2$ through $2.00 \times 10^2$ Pa; gas flow rate ratio between silane ($SiH_4$) gas containing phosphine ($PH_3$) at a concentration of 0.5% and hydrogen gas ($H_2$) should be set to 1/50 through 1/100; discharge power setting should be within a range of 0.01 through 0.1 W/cm$^2$; and deposition temperature setting should be within a range of 180 through 350 degrees Celsius. Accordingly, at the time of the deposition in the present embodiment, the pressure inside the chamber was set to $1.33 \times 10^2$ Pa; silane-gas/hydrogen-gas flow rate ratio was set to 1/70; discharge power was set to 0.05 W/cm$^2$, and deposition temperature was set to 300 degrees Celsius.

As shown in FIG. 6(B), a resist pattern (unillustrated) is formed by photolithography, and then using the resist pattern as a mask, dry etching is performed to the n-type silicon film 125 and the metal film 115 consecutively, to form a source electrode 110 and a drain electrode 112 as well as an n-type silicon layers 120, 121 on their respective upper surfaces. The source electrode 110, the drain electrode 112, and the n-type silicon layers 120, 122 formed on their respective upper surfaces are etched so that they have tapered side surfaces.

As shown in FIG. 6(C), non-doped amorphous silicon is formed by using a capacitance coupling CVD apparatus. Deposition conditions for the non-doped amorphous silicon are detailed here: It is preferable for the formation that pressure setting for the chamber should be within a range of $1.00 \times 10^2$ through $2.00 \times 10^2$ Pa; gas flow rate ratio between silane gas and hydrogen gas should be set within a range of 1/1 through 1/20; discharge power setting should be within a range of 0.01 through 0.1 W/cm$^2$; and deposition temperature setting should be within a range of 180 through 350 degrees Celsius. Accordingly, in the present embodiment, the pressure inside the chamber was set to $1.33 \times 10^2$ Pa; gas flow rate ratio between silane gas and hydrogen gas was set to 1/5; discharge power was set to 0.03 W/cm$^2$, and deposition temperature was set to 300 degrees Celsius.

The amorphous silicon thus formed grows as microcrystalline silicon layers on the n-type silicon layers 120, 121 by reproducing the crystal structure of the n-type silicon layers 120, 121 and becomes microcrystalline silicon regions 135, 136. On the glass substrate 101, on the side surfaces of the source electrode 110 and on the side surfaces of the drain electrode 112, the amorphous silicon grows as amorphous silicon layers and becomes an amorphous silicon region 130. The thickness of the amorphous silicon region 130 should preferably be large so that the TFT 100 will not be electrically affected from the back channel side of the channel layer 140. For this reason, a preferred range of film thickness for the amorphous silicon layer is 60 through 100 nm. In the present embodiment, the thickness is 80 nm. However, on the side surfaces and upper surfaces of the n-type silicon layers 120, 121, microcrystalline silicon layers grow by reproducing the crystal structure of the n-type silicon layers 120, 121 and become microcrystalline silicon regions 135, 136 respectively. The amorphous silicon region 130 and two microcrystalline silicon regions 135, 136 thus formed will collectively be called silicon layer 138.

Next, a non-doped microcrystalline silicon layer 145 is formed on the silicon layer 138 by using a high density plasma CVD apparatus. A preferred range of film thickness for the microcrystalline silicon layer 145 is 10 through 30 nm. In the present embodiment, the thickness is 20 nm. It should be noted here that broken lines in FIG. 6(C) indicates a border between the microcrystalline silicon regions 135, 136 grown from the amorphous silicon and the microcrystalline silicon layer 145 deposited by using the high density plasma CVD apparatus.

Deposition conditions for the non-doped microcrystalline silicon layer 145 will be detailed here: At the time of the deposition, it is preferable that pressure setting for the chamber should be within a range of $1.33 \times 10^{-1}$ through $4.00 \times 10$ Pa; gas flow rate ratio between silane gas and hydrogen gas should be within a range of 1/1 through 1/50; discharge power setting should be within a range of 0.01 through 0.1 W/cm$^2$; and deposition temperature setting should be within a range of 180 through 350 degrees Celsius. Accordingly, at the time of the deposition in the present embodiment, the pressure inside the chamber was set to 1.33 Pa; silane-gas/hydrogen-gas flow rate ratio was set to 1/20; discharge power was set to 0.03 W/cm$^2$, and deposition temperature was set to 300 degrees Celsius. In the present embodiment, the high density plasma CVD apparatus may be of ICP (Inductively Coupled Plasma) type, SWP (Surface Wave Plasma) type or ECR (Electron Cyclotron Resonance) type.

As shown in FIG. 6(D), a silicon nitride (SiN$_x$) film, which will serve as a gate insulation film 150, is deposited on the microcrystalline silicon layer 145 by plasma CVD. A preferred range of film thickness for the gate insulation film 150 is 380 through 480 nm. In the present embodiment, the thickness is 430 nm. Further, a 50-nm thick titanium film and a 100-nm thick aluminum film are deposited consecutively on the gate insulation film 150 by sputtering, as a stacked metal film 165.

As shown in FIG. 7(E), a resist pattern (unillustrated) is formed on the stacked metal film 165 photolithographically and then, using the resist pattern as a mask, dry etching is performed to etch the stacked metal film 165, the gate insulation film 150, the microcrystalline silicon layer 145, the silicon layer 138, and the n-type silicon layers 120, 121 in this order.

This etching process is performed in two steps by reactive ion etching (hereinafter called "RIE"). First, the aluminum film and the titanium film in the stacked metal film 165 are etched by using boron trichloride (BCl$_3$) gas and chlorine (Cl$_2$) gas. Next, the gate insulation film 150, the silicon layer 138, and the n-type silicon layers 120, 121 are etched in this order using carbon tetrafluoride (CF$_4$) gas and oxygen (O$_2$) gas.

Thus, a gate electrode 160, a gate insulation film 150, a channel layer 140 and n-type silicon layers 120, 121 are formed. It should be noted here that the channel layer 140 is composed of the microcrystalline silicon layer 145 and the silicon layer 138. Also, the gate electrode 160, the gate insulation film 150 and the channel layer 140 are formed so that their side surfaces are flush with each other without being stepped from each other.

As shown in FIG. 7(F), a protective film 170 provided by a silicon nitride film is formed by plasma CVD to cover the entire TFT 100. Further, a planarization film 171 of an acrylic photosensitive resin is formed to cover the protective film 170. Then, a contact hole 172 is made in the planarization film 171 to reach the drain electrode connection wire 113 by photolithography.

As shown in FIG. 7(G), a transparent metal film of e.g. ITO (indium tin oxide) is formed on the planarization film 171 by sputtering. The transparent metal film is patterned by photolithography and dry etching, to form a pixel electrode 173 which is connected to the drain electrode connection wire 113 via the contact hole 172.

<2.3 Leakage Current at Ends of Gate Insulation Layer>

The TFT 100 manufactured by the above-described method is subject to leakage current between the gate electrode 160 and the source electrode 110 or between the gate electrode 160 and the drain electrode 112. This is attributable, as shown FIG. 7(E), to the etching process performed with a resist pattern as a mask, which can cause ends of the gate insulation film 150 to allow leakage current to flow. Specifically, during the etching process of the gate insulation film 150, or the microcrystalline silicon layer 145 and the silicon layer 138, crystal defects may have formed on the side surfaces of the gate insulation film 150, or particles of microcrystalline silicon or amorphous silicon may incidentally have redeposited on the side surfaces of the gate insulation film 150 again, thereby shorting between the gate electrode 160 and the channel layer 140, to allow the leakage current.

Figure 8:
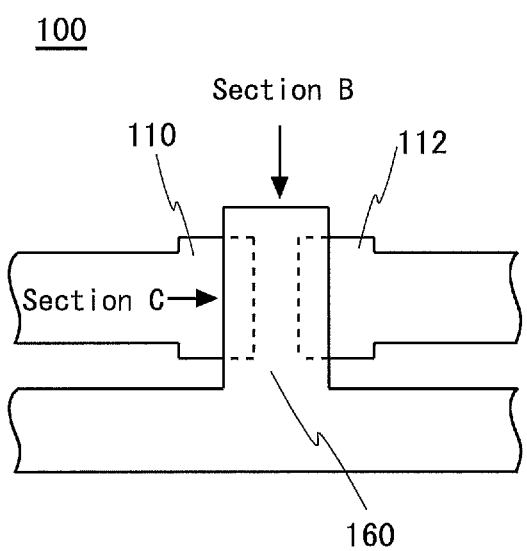
FIG. 8(A) is a plan view of the TFT in FIG. 4.
FIG. 8(B) is a sectional view of a section B in FIG. 8(A)
FIG. 8(C) is a sectional view of a section C in FIG. 8(A).
Figure 8:
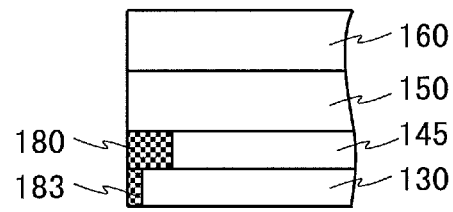
Figure 8:
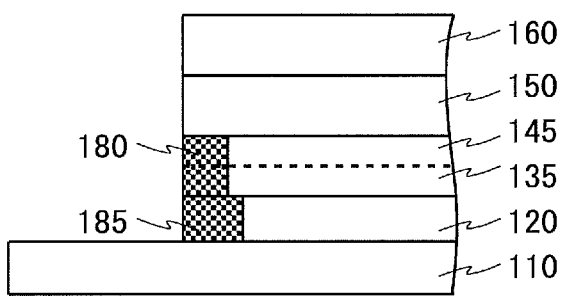

FIG. 8(A) is a plan view of the TFT 100 in FIG. 4; FIG. 8(B) is a sectional view of a section indicated by Arrow B in FIG. 8(A); and FIG. 8(C) is a sectional view of a section indicated by Arrow C in FIG. 8(A). Microcrystalline silicon is apt to natural oxidation by atmospheric oxygen, and simple exposure to the atmosphere leads to formation of a natural oxide film on its surface to a thickness of approximately 3 through 5 nm. Therefore, side surfaces of the microcrystalline silicon region 135 and of the microcrystalline silicon layer 145 exposed by etching are soon covered by the natural oxide film, and for this reason these surfaces are not very much subject to leakage current. However, leakage current will be reliably eliminated if a film of silicon oxide (SiO$_2$) is formed to a thickness of 30 through 100 nm on the side surfaces of the amorphous silicon region 130, the microcrystalline silicon region 135, 136 and the microcrystalline silicon layer 145.

Hence, it is preferable to add a step of forming the oxide silicon film on each side surface of the amorphous silicon region 130, the microcrystalline silicon regions 135, 136 and the microcrystalline silicon layer 145 after the formation of the n-type silicon layers 120, 121 by etching, before the formation of the protective film 170. Such a film of silicon oxide can be formed, for example, in an oxidation process in steam atmosphere or in an oxidation process in dry oxygen atmosphere, at 300 degrees Celsius.

Amorphous silicon is not as apt to natural oxidation as microcrystalline silicon in the atmospheric exposure. Natural oxide film obtained by exposing amorphous silicon to the atmosphere is approximately 1 through 3 nm. If oxidation is performed in steam atmosphere or in dry oxygen atmosphere, a silicon oxide film 183 formed on side surfaces of the amorphous silicon region 130 is thinner than a silicon oxide film 180 formed on side surfaces of the microcrystalline silicon layer 145 and the microcrystalline silicon regions 135, 136. On the other hand, a silicon oxide film 185 formed on side surfaces of the n-type silicon layer 120 is thicker than the silicon oxide film 180 due to enhanced oxidation.

<2.4 Advantages>

Figure 9:
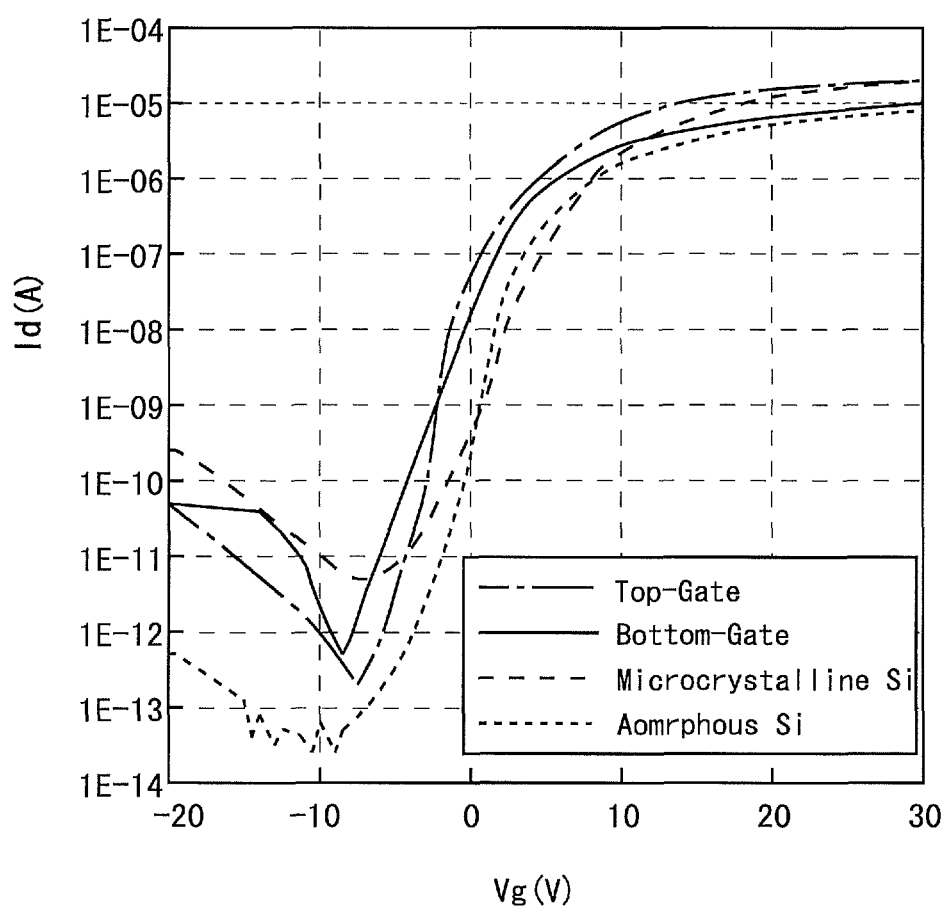
FIG. 9 shows a relationship between gate voltage and drain current (exponential display) in the TFT.

FIG. 9 shows a relationship between gate voltage and drain current (exponential display) in TFTs. With reference to FIG. 9, description will be made for OFF current in each TFT. In a TFT which has its channel layer made only of an amorphous silicon layer (hereinafter called "amorphous silicon TFT"), OFF current is smaller than $1\times10^{-11}$ amperes, i.e., the TFT has a good OFF characteristic. On the other hand, in a TFT which has its channel layer made only of a microcrystalline silicon layer (hereinafter called "microcrystalline silicon TFT"), OFF current is $1\times10^{-11}$ amperes, i.e., greater than that of the amorphous silicon TFT problematically by as much as two digits.

In a bottom-type TFT which has its channel layer made of a stacked film composed of a microcrystalline silicon layer and an amorphous silicon layer, OFF current has values between those of the amorphous silicon TFT and the microcrystalline silicon TFT. In comparison to these TFTs, the TFT 100 according to the present embodiment shows a better OFF characteristic; namely, although its OFF current values are between those of the amorphous silicon TFT and of the microcrystalline silicon TFT like in the bottom-gate TFT, the values are smaller than the values in the bottom-gate TFT.

As understood, the TFT 100 according to the present embodiment has not only the same level of ON characteristic as the microcrystalline silicon TFT but also an advantage that the OFF current is smaller by a digit.

Figure 10:
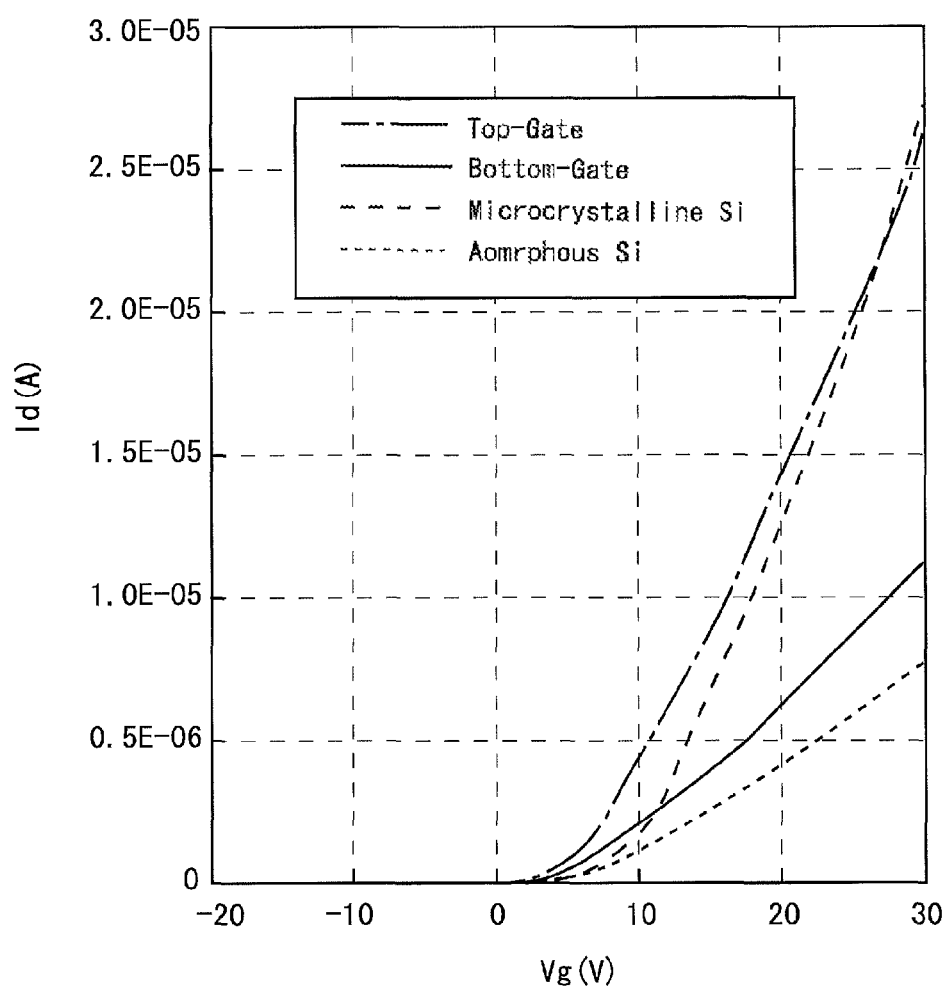
FIG. 10 shows a relationship between gate voltage and drain current (linear display) in the TFT.

FIG. 10 shows a relationship between gate voltage and drain current (linear display) in the TFTs. With reference to FIG. 10, description will be made for ON-state current in each TFT. The amorphous silicon TFT has the smallest ON-state current. In the microcrystalline silicon TFT, ON-state current is greater than two times that of the amorphous silicon TFT when the gate voltage is 20 volts for example. On the other hand, in the bottom-gate TFT, ON-state current is between those of the amorphous silicon TFT and microcrystalline silicon TFT. For example, when the gate voltage is 20 volts, the ON-state current is approximately a half of the ON-state current of the microcrystalline silicon TFT. According to the present embodiment, however, ON-state current in the TFT 100 is further greater than in the microcrystalline silicon TFT, i.e., ON characteristic is better.

As understood, the TFT 100 according to the present embodiment has advantages over the microcrystalline silicon TFT in that ON-state current has the same or a greater level and OFF current is smaller by a digit or more. Also, the present embodiment has an advantage over the bottom-gate TFT in that ON-state current is greater by two times or more, while OFF current is as small as in the bottom-gate TFT.

Also, it is easy, according to the manufacturing method of the present embodiment, to manufacture a TFT 100 in which ON-state current flows only through the microcrystalline silicon regions 135, 136 and the microcrystalline silicon layer 145, i.e., portions made of microcrystalline silicon, and does not flow through the amorphous silicon region 130, i.e., the portion made of amorphous silicon.

Further, it is possible to reliably eliminate leakage current between the gate electrode 160 and the source electrode 110, as well as between the gate electrode 160 and the drain electrode 112 by introducing steps of forming silicon oxide films 180, 183, 185 to a thickness of 30 through 100 nm on etched side surfaces of the microcrystalline silicon layer 145 and the microcrystalline silicon regions 135, 136 after the continuous etching from the gate electrode 160 to the n-type silicon layers 120, 121, before the deposition of the protective film 170.

3. Second Embodiment

<3.1 Configuration of TFT>

Figure 11:
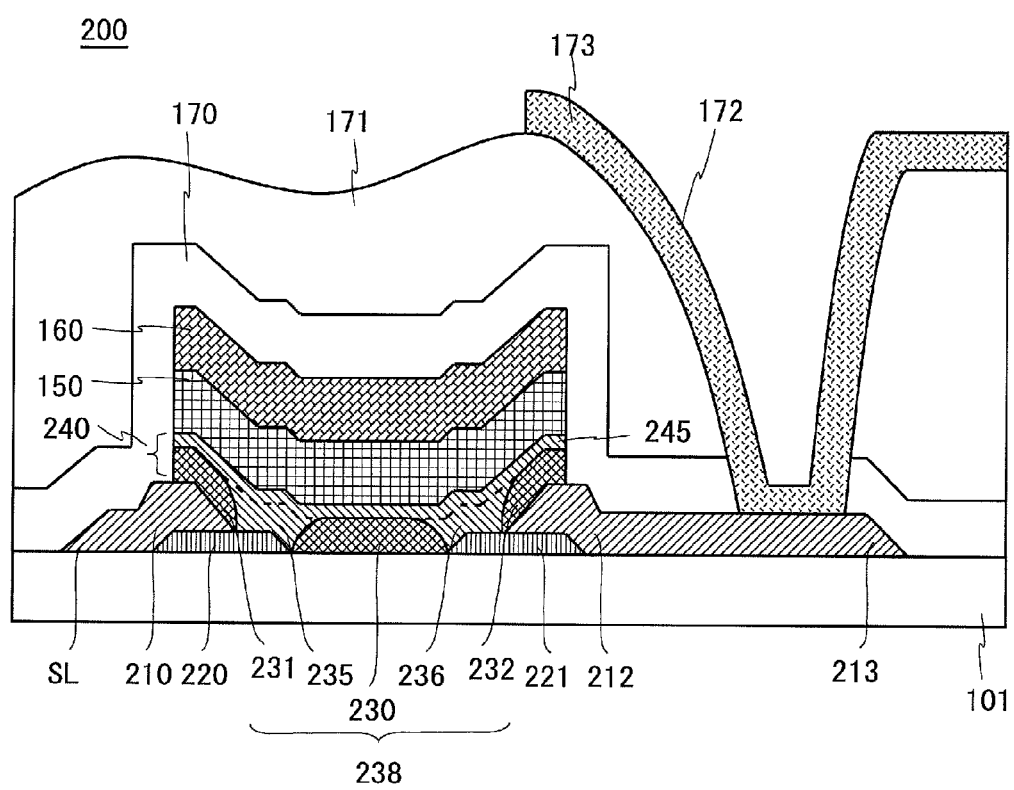
FIG. 11 is a sectional view showing a configuration of a TFT according to a second embodiment.

FIG. 11 is a sectional view showing a configuration of a TFT 200 according to a second embodiment of the present invention. Among the constituent elements of the TFT 200, the same elements as those found in the TFT 100 according to the first embodiment shown in FIG. 5(A) will be indicated with the same reference symbols. The description hereinafter will focus primarily on different constituent elements.

As shown in FIG. 11, on an insulated substrate provided by a glass substrate 101, n-type silicon layers (also will be called impurity-doped semiconductor layers) 220, 221 made of microcrystalline silicon and having tapered side surfaces are disposed at a predetermined distance from each other. The n-type silicon layer 220 has an exposed end on the side opposing to the n-type silicon layer 221, and an end covered by a source electrode 210. Also, the n-type silicon layer 221 has an exposed end on the side opposing to the n-type silicon layer 220, and an end covered by a drain electrode 212.

Microcrystalline silicon regions 235, 236 are formed on the n-type silicon layers 220, 221 respectively. An amorphous silicon region 230, and amorphous silicon regions 231, 232 are formed respectively in an area of the glass substrate 101 between the n-type silicon layers 220, 221; on the source electrode 210; and on the drain electrode 212. These three amorphous silicon regions 230, 231, 232, and two microcrystalline silicon regions 235, 236 thus formed will collectively be called silicon layer 238 (may also be called the first semiconductor layer).

Further, a microcrystalline silicon layer 245 (also called the second semiconductor layer) is formed on the silicon layer 238. The stacked film composed of the silicon layer 238 and the microcrystalline silicon layer 245 serves as a channel layer 240 of the TFT 200. The gate insulation film 150, the gate electrode 160, etc. are disposed in the same manner as in the TFT 100, so their description will not be repeated here. Like in the TFT 100, the channel layer 240, the gate insulation film 150 and the gate electrode 160 have their relevant side surfaces flush with each other.

In this case, the source electrode 210 is electrically connected to the microcrystalline silicon region 235, with the n-type silicon layer 220 sandwiched in between whereas the drain electrode 212 is electrically connected to the microcrystalline silicon region 236, with the n-type silicon layer 221 sandwiched in between. Therefore, ON-state current in the TFT 200 flows from the drain electrode 212, through the n-type silicon layer 221, the microcrystalline silicon region 236, the microcrystalline silicon layer 245, the microcrystalline silicon region 235, and the n-type silicon layer 220 in this order, to the source electrode 210. As understood from the above, ON-state current in the TFT 200 is large like in the TFT 100 according to the first embodiment because it flows from the drain electrode 212 to the source electrode 210 without passing through a high resistance amorphous silicon layer. Also, OFF current is small because of the amorphous silicon region 230 formed on the back gate side of the channel layer 240.

<3.2 Method for Manufacturing TFT>

Figure 12:
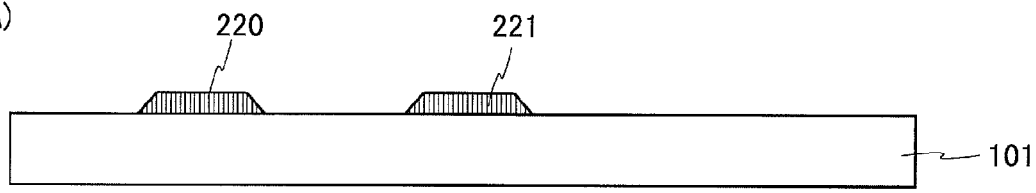
FIGS. 12(A) through (D) are sectional views showing steps in a method for manufacturing the TFT in FIG. 11.
Figure 12:
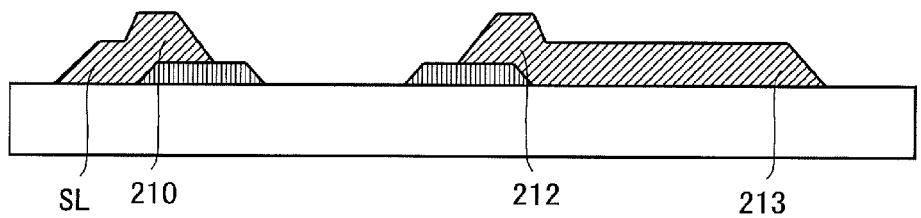
Figure 12:
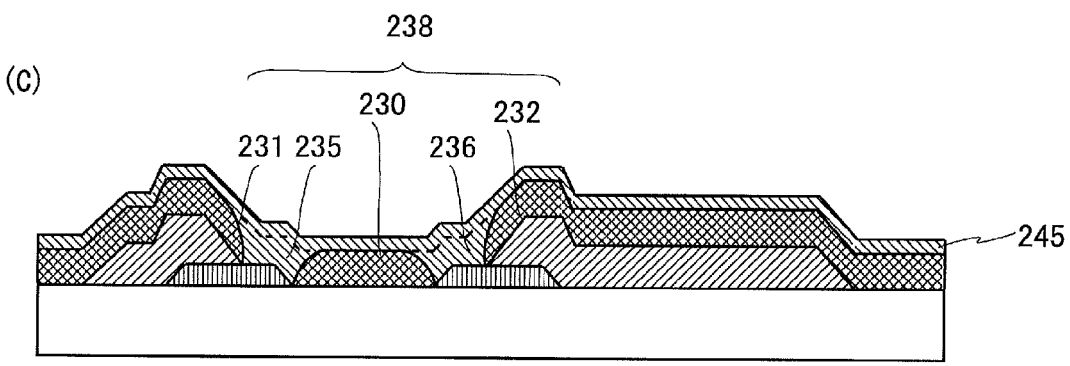
Figure 12:
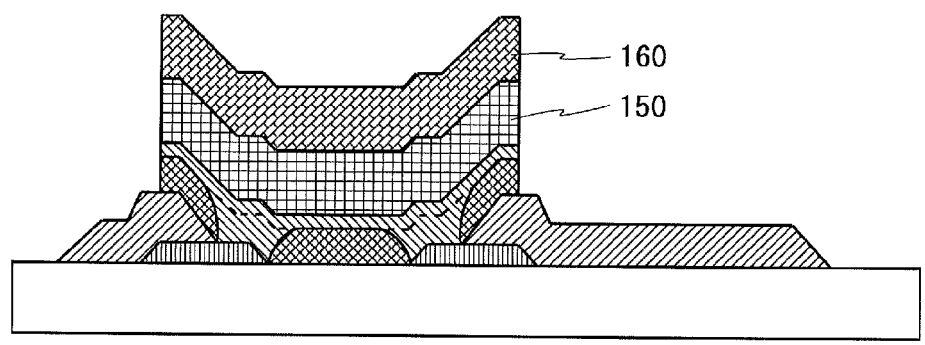
Figure 13:
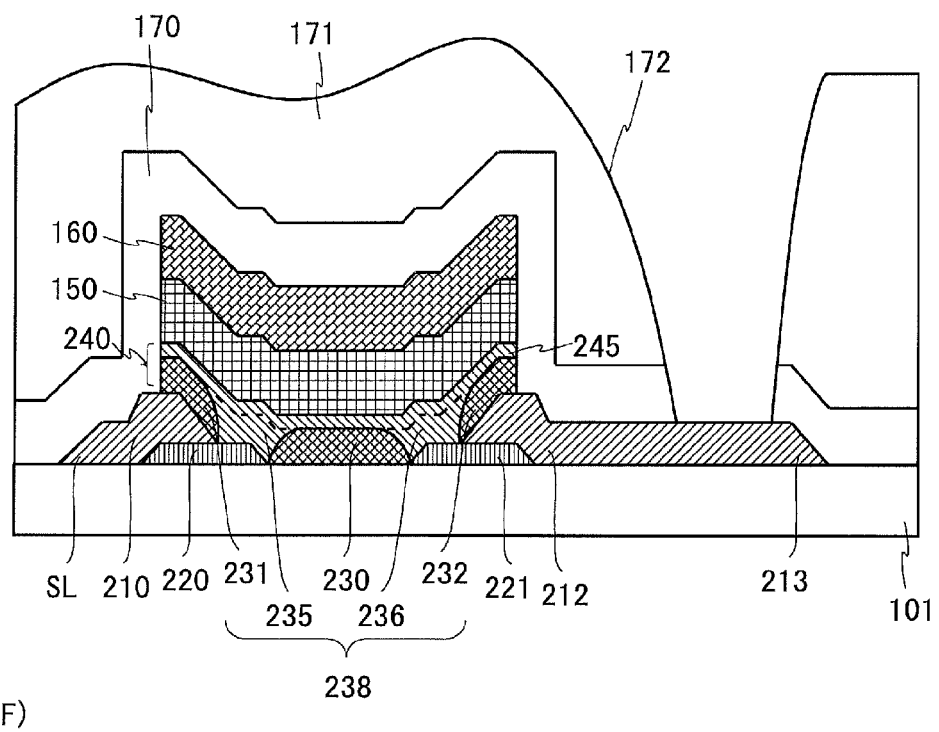
FIGS. 13(E) and (F) are sectional views showing steps in the method for manufacturing the TFT in FIG. 11.
Figure 13:
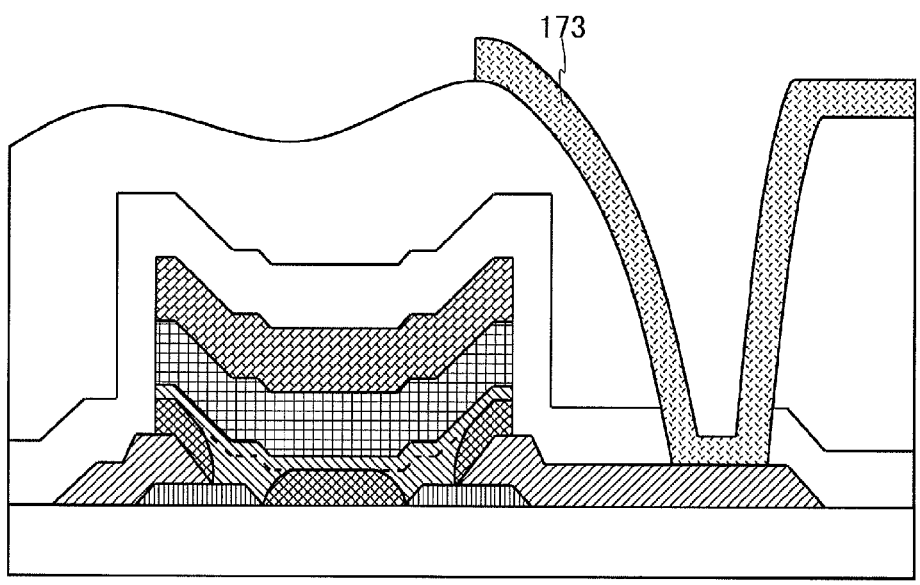

FIG. 12 and FIG. 13 are sectional views which show steps in a method for manufacturing the TFT 200 in FIG. 11. Among the constituent steps of the method for manufacturing the TFT 200, a few steps are the same as those found in FIG. 6 and FIG. 7, for which the same reference symbols as used in the method for manufacturing the TFT 100 according to the first embodiment will be used. The description hereinafter will focus primarily on the steps which are different from those.

As shown in FIG. 12(A), an n-type silicon film (unillustrated) doped with high concentration n-type impurities is deposited on an entire surface of the glass substrate 101 by using a capacitance coupling CVD apparatus. Detailed deposition conditions and thickness of the n-type silicon film are identical with those for the TFT 100, and are not repeated here. Next, a resist pattern (unillustrated) is formed photolithographically on the n-type silicon film, and using the resist pattern as a mask, the n-type silicon film is etched by RIE. As a result, two n-type silicon layers 220, 221 are formed on the glass substrate 101. RIE is employed because of its easiness in controlling the shape of side surfaces of the n-type silicon layers 220, 221.

As shown in FIG. 12(B), an aluminum film and a titanium film are deposited consecutively by sputtering, as a stacked metal film (unillustrated). Next, a resist pattern (unillustrated) is formed photolithographically on the stacked metal film, and using the resist pattern as a mask, the stacked metal film is etched to form the source electrode 210 and the drain electrode 212. This exposes mutually opposed ends of the n-type silicon layer 220 and the n-type silicon layer 221, and an area of the glass substrate 101 located therebetween.

It should be noted here that a wet etching method is preferred for etching the stacked metal film, in order to avoid damages in the n-type silicon layers 220, 221. The etchant for the wet etching method may be provided by aqueous solution containing hydrofluoric acid (HF) at a concentration of 0.5 through 2% and nitric acid (HNO₃) at a concentration of 0.5 through 2%.

As shown in FIG. 12(C), non-doped amorphous silicon is formed by using a capacitance coupling plasma CVD apparatus. Detailed deposition conditions and thickness of the amorphous silicon layer to be deposited are identical with those for the TFT 100, and are not repeated here.

The formed amorphous silicon grows as microcrystalline silicon layers on the n-type silicon layers 220, 221 by reproducing the crystal structure of the n-type silicon layers 220, 221 and becomes microcrystalline silicon regions 235, 236. On the other hand, on the glass substrate 101, and on the source electrode 210 or on the drain electrode 212, the amorphous silicon grows as an amorphous silicon layer. As a result, amorphous silicon regions 230, 231, 232 are formed on the area of the glass substrate 101 between the n-type silicon layer 220 and the n-type silicon layer 221, on the upper surface and tapered side surfaces of the source electrode 210, as well as on the upper surface and tapered side surfaces of the drain electrode 212 respectively. These three amorphous silicon regions 230, 231, 232, and two microcrystalline silicon regions 235, 236 thus formed will collectively be called silicon layer 238.

FIG. 12(D) through FIG. 13(F) shows manufacturing steps, which are identical with those shown in FIG. 7(E) through FIG. 7(G) for the TFT 100, and thus will not be repeated here.

It should be noted here, however, that like the TFT 100, the TFT 200 also has its gate electrode 160, gate insulation film 150 and channel layer 240 formed so that their side surfaces are flush with each other without being stepped from each other. In this case, it is preferable to add a step of forming an oxide silicon film on each side surface of the amorphous silicon regions 230, 231, 232, the microcrystalline silicon regions 235, 236 and the microcrystalline silicon layer 245 after the formation of the silicon layer 238 by etching, before the formation of a protective film 170. Such a film of silicon oxide as described can be formed, for example, in an oxidation process in steam atmosphere or in an oxidation process in dry oxygen atmosphere, at 300 degrees Celsius.

<3.3 Advantages>

The TFT 200 according to the present embodiment offers the same advantages as offered by the TFT 100 according to the first embodiment, so they will not be repeated here.

4. Third Embodiment

<4.1 Configuration of TFT>

Figure 14:
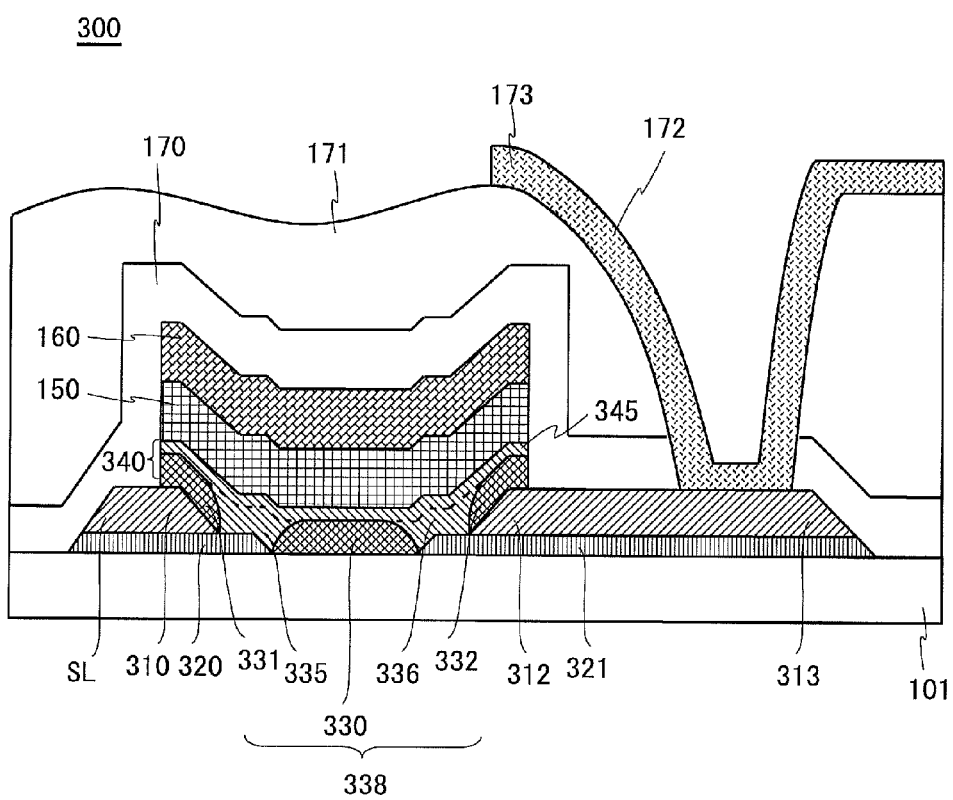
FIG. 14 is a sectional view showing a configuration of a TFT according to a third embodiment.

FIG. 14 is a sectional view showing a configuration of a TFT 300 according to a third embodiment of the present invention. Among the constituent elements of the TFT 300, the same elements as those found in the TFT 200 according to the second embodiment shown in FIG. 11 will be indicated with the same reference symbols, and the description hereinafter will focus primarily on different constituent elements.

As shown in FIG. 14, two n-type silicon layers (also will be called impurity-doped semiconductor layers) 320, 321 of microcrystalline silicon which have tapered side surfaces are opposed to each other on a glass substrate 101. The n-type silicon layer 320 has an exposed end on a side opposed to the n-type silicon layer 321 whereas another end is flush with an end of the image signal lines SL, being different from the TFT 200. The n-type silicon layer 321 has an exposed end on the side opposed to the n-type silicon layer 320 whereas another end is flush with an end of a drain electrode connection wire 313, being different from the TFT 200.

A silicon layer 338 (also called the first semiconductor layer), and a microcrystalline silicon layer 345 (also called the second semiconductor layer) which is formed on the silicon layer 338 have the same shapes as in the TFT 200, so they will not be detailed any more. The stacked film composed of the silicon layer 338 and the microcrystalline silicon layer 345 serves as the channel layer 340 of the TFT 300. The gate insulation film 150, the gate electrode 160, etc. are disposed in the same manner as in the TFT 200, so their description will not be repeated here. Like in the TFT 100, the channel layer 340, the gate insulation film 150 and the gate electrode 160 have their relevant side surfaces formed flush with each other.

In this case again, the source electrode 310 is electrically connected to the microcrystalline silicon region 335, with the n-type silicon layer 320 sandwiched in between whereas the drain electrode 312 is electrically connected to the microcrystalline silicon region 336, with the n-type silicon layer 321 sandwiched in between. Therefore, ON-state current in the TFT 300 flows from the drain electrode 312, through the n-type silicon layer 321, the microcrystalline silicon region 336, the microcrystalline silicon layer 345, the microcrystalline silicon region 335, and the n-type silicon layer 320 in this order, and then to the source electrode 310. As understood from the above, ON-state current is large like in the TFT 100 according to the first embodiment because it flows from the drain electrode 312 to the source electrode 310 without passing through a high resistance amorphous silicon layer. Also, OFF current is small because of the amorphous silicon region 330 formed on the back gate side of the channel layer 340.

<4.2 Method for Manufacturing TFT>

Figure 15:
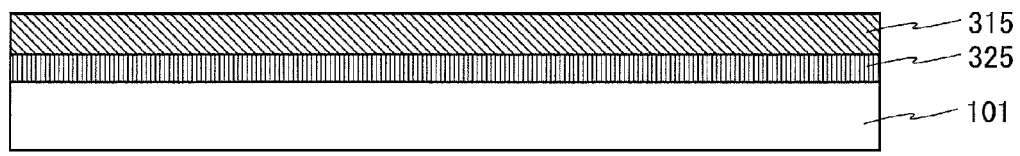
FIGS. 15(A) through (D) are sectional views showing steps in a method for manufacturing the TFT in FIG. 14.
Figure 15:
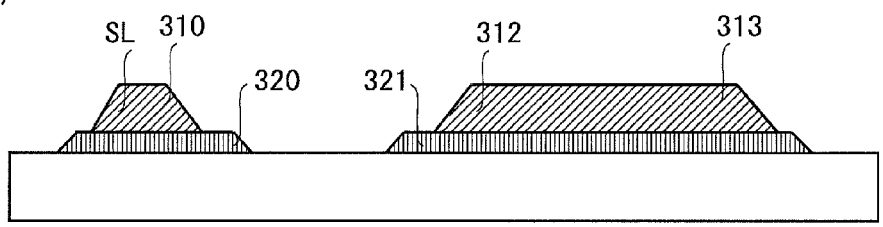
Figure 15:
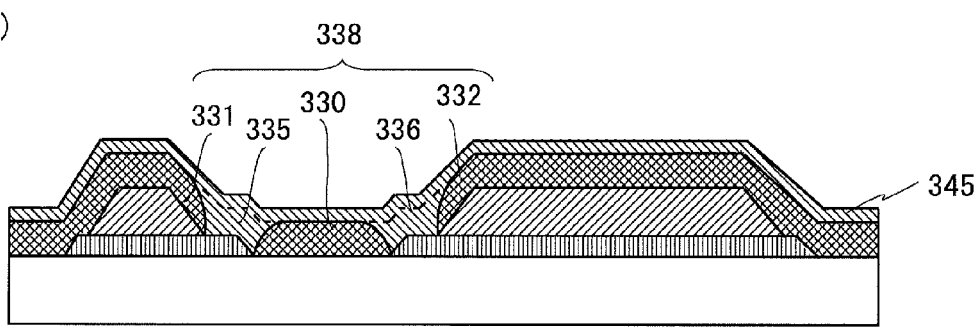
Figure 15:
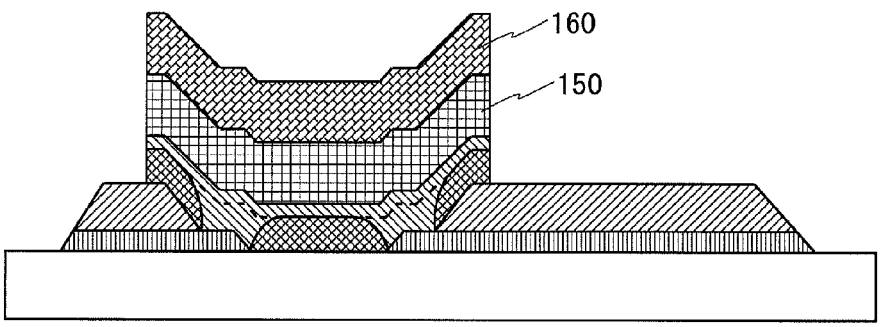
Figure 16:
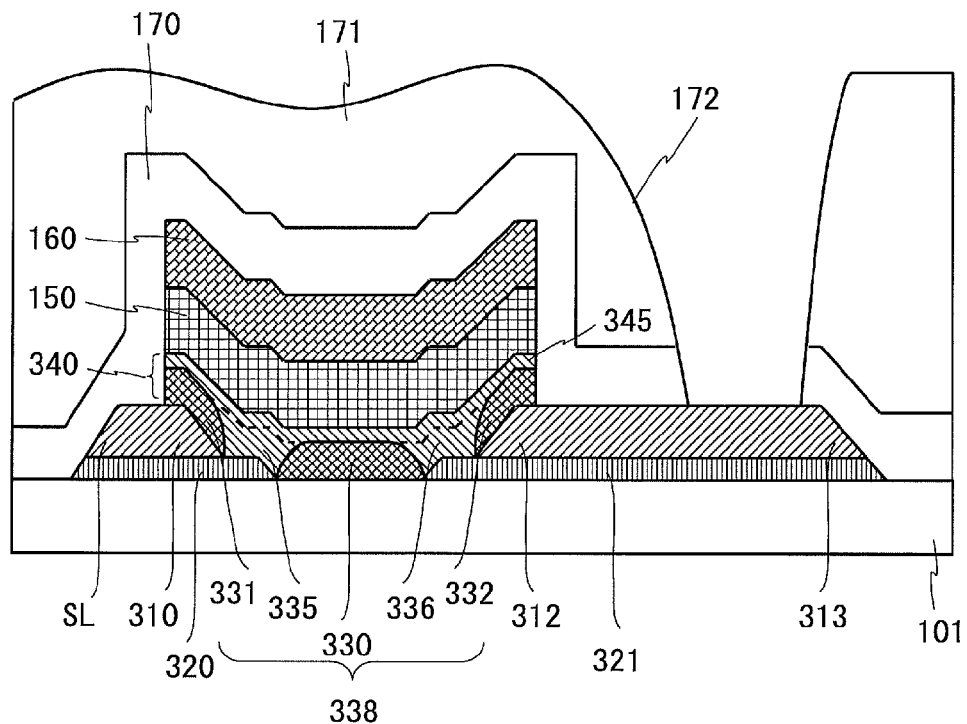
FIGS. 16(E) and (F) are sectional views showing steps in the method for manufacturing the TFT in FIG. 14.
Figure 16:
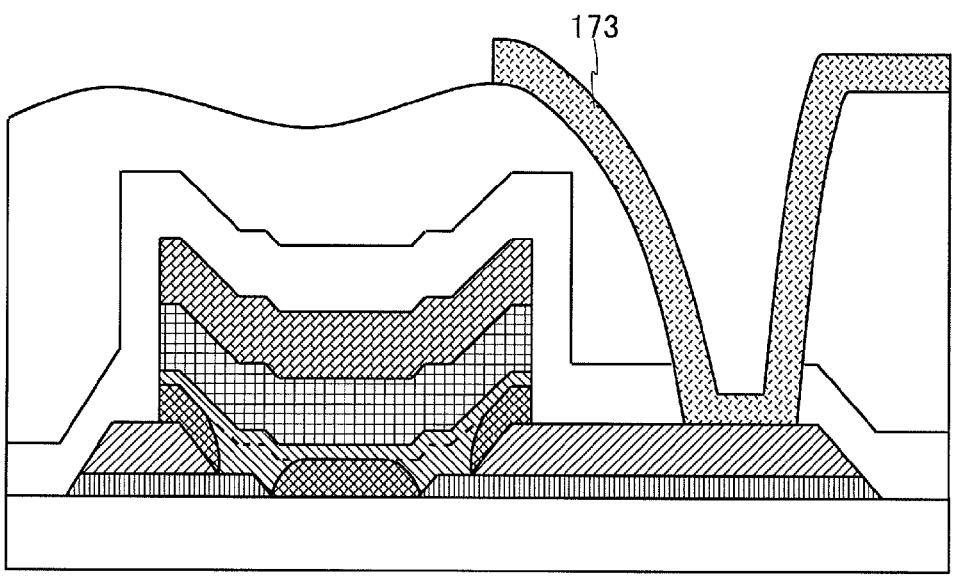

FIG. 15 and FIG. 16 are sectional views which show steps in a method for manufacturing the TFT 300 in FIG. 14. Among the constituent steps of the method for manufacturing the TFT 300, a few steps are the same as those found in FIG. 12 and FIG. 13, for which the same reference symbols as used in the method for manufacturing the TFT 200 will be used. The description hereinafter will focus primarily on the steps which are different from those.

As shown in FIG. 15(A), an n-type silicon film 325 doped with high concentration n-type impurities is deposited on the entire surface of the glass substrate 101 by using a capacitance coupling CVD apparatus. Detailed deposition conditions and thickness of the n-type silicon film 325 are identical with those for the TFT 200, and are not repeated here. Next, a 100-nm thick aluminum film and a 50-nm thick titanium film are deposited consecutively on the n-type silicon film 325 by sputtering, as a stacked metal film 315.

As shown in FIG. 15(B), a resist pattern (unillustrated) is formed photolithographically on the stacked metal film 315, and using the resist pattern as a mask, dry etching is performed to the stacked metal film 315 and the n-type silicon film 325. As a result, the source electrode 310 and the n-type silicon layer 320 have the same shape whereas the drain electrode 312 and the n-type silicon layer 321 have the same shape. Next, wet etching method is performed to etch the aluminum film and the titanium film, using an aqueous solution containing hydrofluoric acid at a concentration of 0.5 through 2% and nitric acid at a concentration of 0.5 through 2%. In this case, the aluminum film and the titanium film are etched isotropically, leaving the source electrode 310 and drain electrode 312 with shorter length than that of the n-type silicon layers 320, 321, and thereby leaving the ends of the n-type silicon layers 320, 321 extended from the respective ends of the source electrode 310 and the drain electrode 312.

As shown in FIG. 15(C), non-doped amorphous silicon is formed by using a capacitance coupling plasma CVD apparatus. Detailed deposition conditions and thickness of the amorphous silicon layer to be deposited are identical with those for the TFT 100, so they are not repeated here.

The formed amorphous silicon grows as microcrystalline silicon layers on the n-type silicon layers 320, 321 by reproducing the crystal structure of the n-type silicon layers 320, 321 and becomes microcrystalline silicon regions 335, 336. On the other hand, on the glass substrate 101, the source electrode 310 or the drain electrode 312, the amorphous silicon grows as an amorphous silicon layer. As a result, amorphous silicon regions 330, 331, 332 are formed on the glass substrate 101 between the n-type silicon layer 320 and the n-type silicon layer 321, on the upper surface and tapered side surface of the source electrode 310, as well as on the upper surface and tapered side surface of the drain electrode 312 respectively. These three amorphous silicon regions 330, 331, 332, and two microcrystalline silicon regions 335, 336 thus formed will collectively be called silicon layer 338.

As shown in FIG. 15(D), a gate insulation film and a metal film (unillustrated) are deposited to cover an entire surface of the glass substrate 101 including the source electrode 310 and the drain electrode 312. Next, using a resist pattern (unillustrated) formed on the metal film as a mask, etching is performed to the metal film, the gate insulation film, the microcrystalline silicon layer 345 and the silicon layer 338 consecutively, to form a gate electrode 160, a gate insulation film 150 and a channel layer 340. During this dry etching, the end of the n-type silicon layer 320 extending from the end of the image signal lines SL, and the end of the n-type silicon layer 321 extending from the end of the connection wire 313 are also etched. Consequently, the end of the n-type silicon layer 320 becomes flush with the end of the image signal lines SL while the end of the n-type silicon layer 321 becomes flush with the end of the drain electrode connection wire 313.

FIG. 16(E) and FIG. 16(F) show manufacturing steps, which are identical with those shown in FIG. 13(E) and FIG. 13(F), and thus will not be repeated here.

It should be noted here, however, like the TFT 100, the TFT 300 also has its gate electrode 160, gate insulation film 150 and channel layer 340 formed so that their side surfaces are flush with each other without being stepped from each other. In this case, it is preferable to add a step of forming an oxide silicon film on each side surface of the amorphous silicon regions 330, 331, 332, the microcrystalline silicon regions 335, 336 and the microcrystalline silicon layer 345 after the formation of the silicon layer 338 by etching, before the formation of a protective film 170. Such a film of silicon oxide as described can be formed, for example, in an oxidation process in steam atmosphere or in an oxidation process in dry oxygen atmosphere, at 300 degrees Celsius.

<4.3 Advantages>

The TFT 300 according to the present embodiment offers the same advantages as offered by the TFT 100 according to the first embodiment, so they will not be repeated here.

5. Fourth Embodiment

<5.1 Configuration of TFT>

Figure 17:
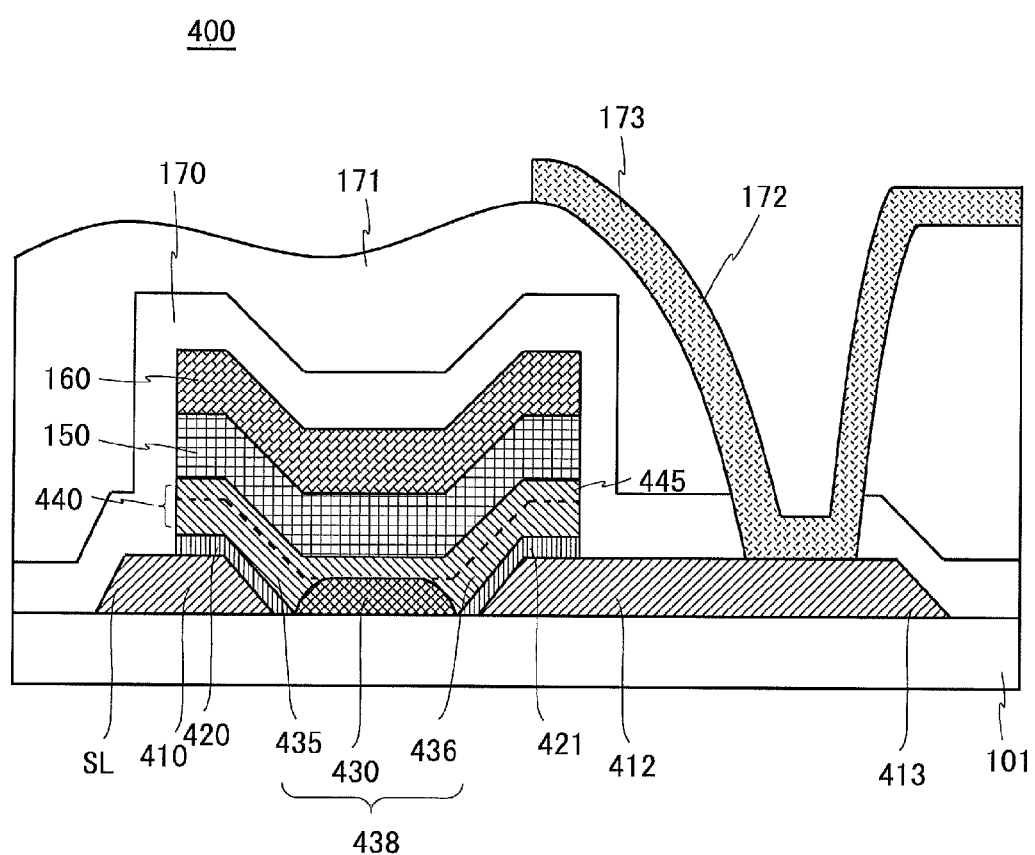
FIG. 17 is a sectional view showing a configuration of a TFT according to a fourth embodiment.

FIG. 17 is a sectional view showing a configuration of a TFT 400 according to a fourth embodiment of the present invention. Among the constituent elements of the TFT 400, the same elements as those found in the TFT 100 according to the first embodiment shown in FIG. 5(A) will be indicated with the same reference symbols, and the description hereinafter will focus primarily on different constituent elements.

As shown in FIG. 17, a source electrode 410 and a drain electrode 412 which are made from stacked metals of an aluminum film and a titanium film and have tapered side surfaces are spaced from each other on a glass substrate 101. N-type silicon layers (also called impurity-doped semiconductor layers) 420, 421 are formed to cover part of upper surfaces and mutually opposed tapered side surfaces of the source electrode 410 and the drain electrode 412.

Microcrystalline silicon regions 435, 436 are formed on the n-type silicon layers 420, 421 respectively. An amorphous silicon region 430 is formed on an area of the glass substrate 101 between the n-type silicon layers 420, 421. The amorphous silicon region 430 and two microcrystalline silicon regions 435, 438 thus formed will collectively be called silicon layer 438 (may also be called the first semiconductor layer). Further, a microcrystalline silicon layer 445 (also called the second semiconductor layer) is formed on the silicon layer 438. The stacked film composed of the silicon layer 438 and the microcrystalline silicon layer 445 serves as the channel layer 440 of the TFT 400. The gate insulation film 150, the gate electrode 160, etc. are disposed in the same manner as in the TFT 100, so their description will not be repeated here. Like in the TFT 100, the channel layer 440, the gate insulation film 150 and the gate electrode 160 have their relevant side surfaces formed flush with each other.

In this case again, the source electrode 410 is connected to the microcrystalline silicon region 435, with the n-type silicon layer 420 sandwiched in between whereas the drain electrode 412 is connected to the microcrystalline silicon region 436, with the n-type silicon layer 421 sandwiched in between. Therefore, ON-state current in the TFT 400 flows from the drain electrode 412, through the n-type silicon layer 421, the microcrystalline silicon region 436, the microcrystalline silicon layer 445, the microcrystalline silicon region 435, and the n-type silicon layer 420 in this order, and then to the source electrode 410. As understood from the above, ON-state current is large like in the TFT 100 according to the first embodiment because the current flows from the drain electrode 412 to the source electrode 410 without passing through a high resistance amorphous silicon layer. Also, OFF current is small because of the amorphous silicon region 430 formed on the back gate side of the channel layer 440.

<5.2 Method for Manufacturing TFT>

Figure 18:
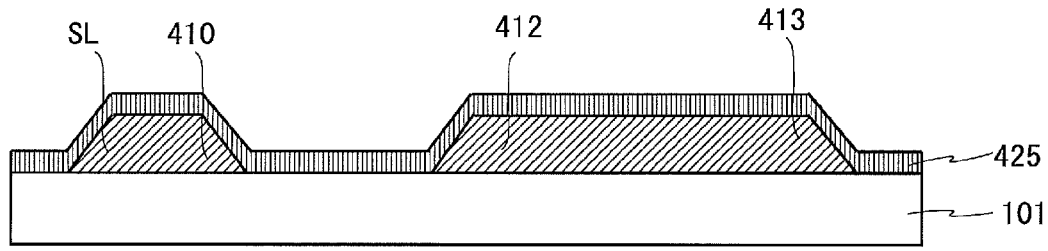
FIGS. 18(A) through (D) are sectional views showing steps in a method for manufacturing the TFT in FIG. 17.
Figure 18:
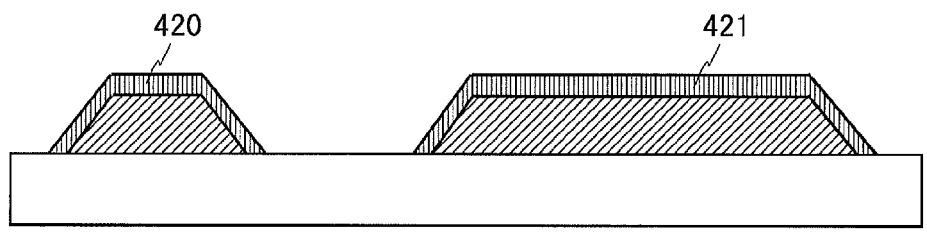
Figure 18:
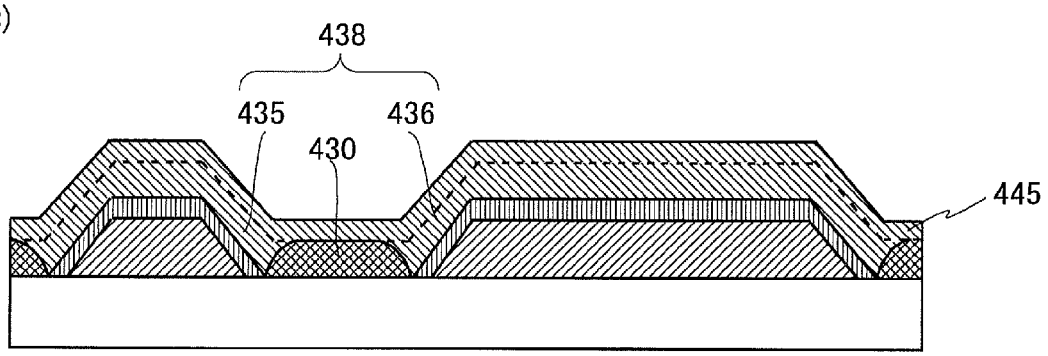
Figure 18:
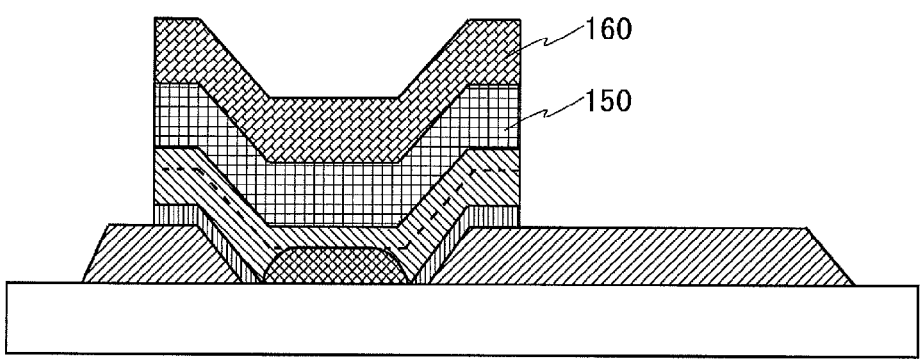
Figure 19:
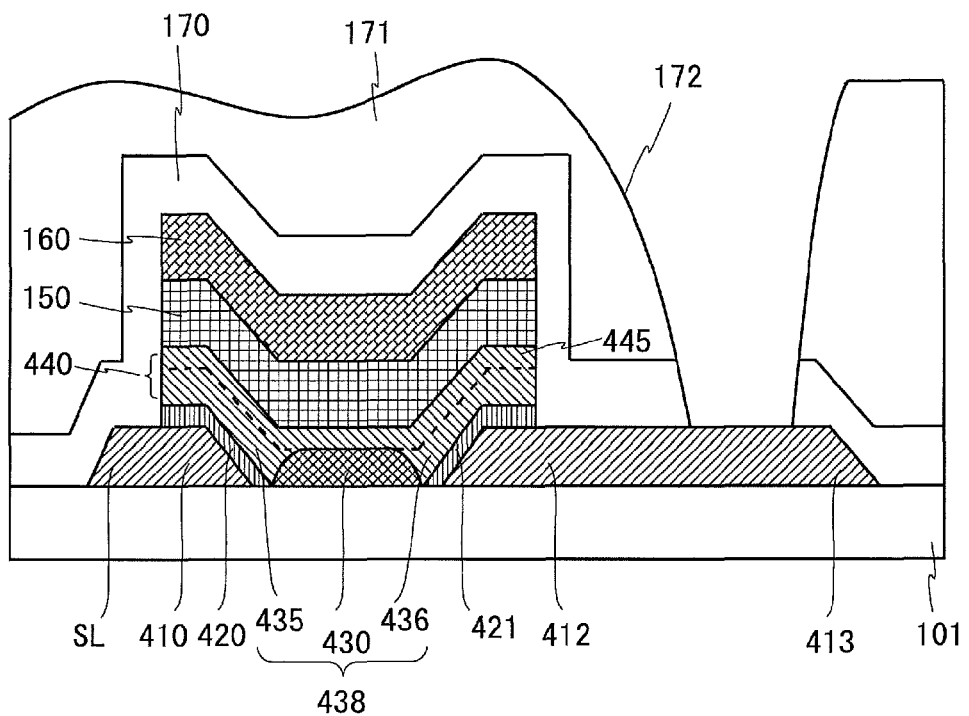
FIGS. 19(E) and (F) are sectional views showing steps in the method for manufacturing the TFT in FIG. 17.
Figure 19:
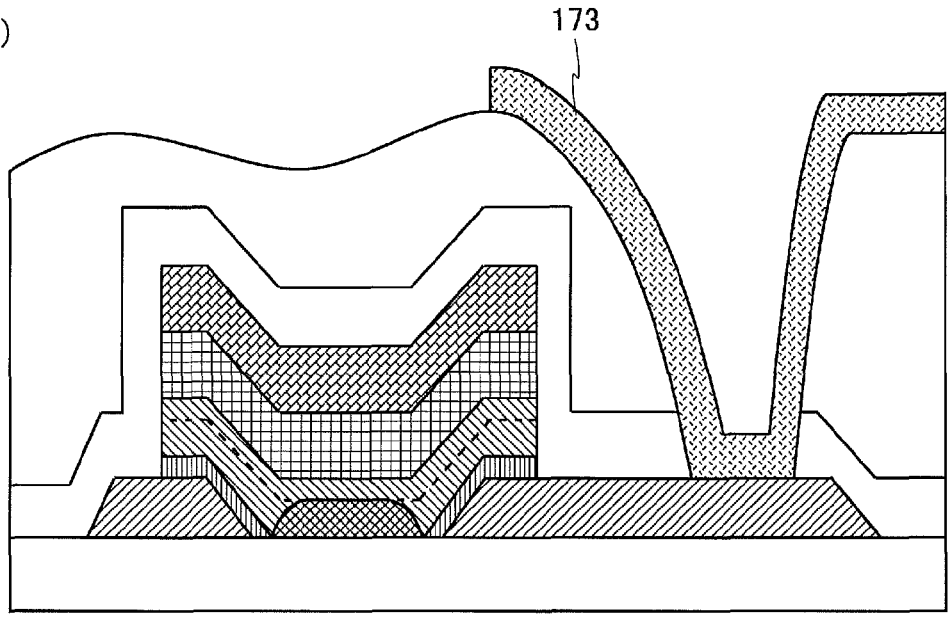

FIG. 18 and FIG. 19 are sectional views which show steps in a method for manufacturing the TFT 400 in FIG. 17. Among the constituent steps of the method for manufacturing the TFT 400, a few steps are the same as those found in FIG. 6 and FIG. 7, for which the same reference symbols as used in the method for manufacturing the TFT 100 will be used. The description hereinafter will focus primarily on the steps which are different from those.

As shown in FIG. 18(A), an aluminum film and a titanium film are deposited on a glass substrate 101 consecutively by sputtering, as a stacked metal film (unillustrated). Next, a resist pattern (unillustrated) is formed photolithographically on the stacked metal film, and using the resist pattern as a mask, the stacked metal film is dry etched to form a source electrode 410 and a drain electrode 412. Next, using a capacitance coupling CVD apparatus, an n-type silicon film 425 containing high concentration n-type impurities is deposited to cover an entire surface of the glass substrate 101 including the source electrode 410 and the drain electrode 412. Detailed deposition conditions and thickness of the n-type silicon film 425 are identical with those for the TFT 100, and are not repeated here.

As shown in FIG. 18(B), a resist pattern (unillustrated) is formed photolithographically on the n-type silicon film 425, and using the resist pattern as a mask, the n-type silicon film 425 is dry etched. Thus, while the source electrode 410 and the drain electrode 412 are completely covered by the n-type silicon layers 420, 421, an area on the glass substrate 101 between the source electrode 410 and the drain electrode 412 is exposed.

As shown in FIG. 18(C), non-doped amorphous silicon is deposited by using a capacitance coupling CVD apparatus. Detailed deposition conditions and thickness of the amorphous silicon layer to be formed are identical with those for the TFT 100, and not repeated here.

The formed amorphous silicon grows as microcrystalline silicon layers on the n-type silicon layers 420, 421 by reproducing the crystal structure of the n-type silicon layers 420, 421 and becomes microcrystalline silicon regions 435, 436. On the glass substrate 101, the amorphous silicon grows as an amorphous silicon layer and becomes an amorphous silicon region 430. The amorphous silicon region 430 and two microcrystalline silicon regions 435, 436 thus formed will collectively be called silicon layer 438.

Next, a non-doped microcrystalline silicon layer 445 is deposited on the silicon layer 438 by using a high density plasma CVD apparatus. Detailed deposition conditions and thickness of the non-doped microcrystalline silicon layer 445 are identical with those for the TFT 100, and are not repeated here.

FIG. 18(D) through FIG. 19(F) show manufacturing steps, which are identical with those shown in FIG. 7(E) through FIG. 7(G), and thus will not be repeated here.

It should be noted here, however, like the TFT 100, the TFT 400 also has its gate electrode 160, gate insulation film 150 and channel layer 440 formed so that their side surfaces are flush with each other without being stepped from each other. In this case, it is preferable to add a step of forming an silicon oxide film on each side surface of the amorphous silicon regions 430, the microcrystalline silicon regions 435, 436 and the microcrystalline silicon layer 445, after the formation of the n-type silicon layers 420, 421 by etching, before the formation of a protective film 170. Such a film of silicon oxide as described can be formed, for example, in an oxidation process in steam atmosphere or in an oxidation process in dry oxygen atmosphere, at 300 degrees Celsius.

<5.3 Advantages>

The TFT 400 according to the present embodiment offers the same advantages as offered by the TFT 100 according to the first embodiment, so they will not be repeated here.

6. Others

It is known that doping a silicon layer with germanium will accelerate crystallization in the silicon layer. Accordingly, the n-type silicon layers 120, 121, 220, 221, 320, 321, 420, 421 utilized in the embodiments described thus far may be replaced by silicon germanium layers, i.e., silicon layers doped with germanium. In this case, it is preferable that the microcrystalline silicon layer which constitutes part of the TFT channel layer should also be doped with germanium. Also, in each of the embodiments given thus far, the n-type silicon layers in the TFTs 100 through 400 are described as microcrystalline silicon layers containing high concentration n-type impurities. However, the microcrystalline silicon layers may be those containing a high concentration p-type impurity.

INDUSTRIAL APPLICABILITY

The present invention is applicable to active matrix display devices such as active matrix liquid crystal display devices, and is particularly suitable for switching elements in pixel formation portions in the matrix-type display devices.

DESCRIPTION OF THE REFERENCE NUMERALS

100, 200, 300, 400 . . . Thin film transistors (TFT)
101 . . . Glass substrate (insulated substrate)
110, 210, 310, 410 . . . Source electrodes
112, 212, 312, 412 . . . Drain electrodes
120, 121, 220, 221, 320, 321, 420, 421 . . . N-type silicon layers
130, 131, 132, 230, 231, 232, 330, 331, 332, 430 . . . Amorphous silicon regions
135, 136, 235, 236, 335, 336, 435, 436 . . . Microcrystalline silicon regions
138, 238, 338, 438 . . . Silicon layers
140, 240, 340, 440 . . . Channel layers
145, 245, 345, 445 . . . Microcrystalline silicon layers
150 . . . Gate insulation film
160 . . . Gate electrode
180 . . . Silicon oxide film

The invention claimed is:

1. A top-gate thin film transistor formed on an insulated substrate, comprising:
   a source electrode and a drain electrode;
   a first and a second impurity-doped semiconductor layers containing one of first and second electrically conductive impurities, and electrically connected to the source electrode and drain electrode respectively;
   a first semiconductor layer including microcrystalline semiconductor regions formed on the first and the second impurity-doped semiconductor layers respectively, and an amorphous semiconductor region formed on an area not formed with the microcrystalline semiconductor regions;
   a second semiconductor layer of a microcrystalline semiconductor formed on the first semiconductor layer; and
   a gate insulation film formed on the second semiconductor layer;
   the first and the second impurity-doped semiconductor layers being provided by a microcrystalline semiconductor and electrically connected to the second semiconductor layer, with the microcrystalline semiconductor regions of the first semiconductor layer sandwiched therebetween.

2. The thin film transistor according to claim 1, wherein the source electrode and the drain electrode are formed on the insulated substrate, the first and the second impurity-doped semiconductor layers being formed on upper surfaces of the source electrode and the drain electrode respectively, the amorphous semiconductor region being formed on an area of the insulated substrate between the source electrode and the drain electrode, as well as on side surfaces of the source electrode and of the drain electrode, the microcrystalline semiconductor regions being formed on the first and the second impurity-doped semiconductor layers respectively.

3. The thin film transistor according to claim 1, wherein the first and the second impurity-doped semiconductor layers are spaced from each other by a predetermined distance on the insulated substrate, the source electrode and the drain electrode being formed on the first and the second impurity-doped semiconductor layers, leaving mutually opposed end portions of the first and the second impurity-doped semiconductor layers exposed respectively, the amorphous semiconductor region being formed on an area of the insulated substrate between the first and the second impurity-doped semiconductor layers, as well as on the source electrode and the drain electrode, the microcrystalline semiconductor regions being formed on exposed areas of the first and the second impurity-doped semiconductor layers exposed from the source electrode and the drain electrode respectively.

4. The thin film transistor according to claim 1, wherein the source electrode and the drain electrode are formed on the insulated substrate, the first and the second impurity-doped semiconductor layers covering side surfaces and at least part of upper surfaces of the source electrode and the drain electrode, the amorphous semiconductor region being formed on an area of the insulated substrate between the first and the second impurity-doped semiconductor layers, the microcrystalline semiconductor regions being formed on the first and on the second impurity-doped semiconductor layers respectively.

5. The thin film transistor according to claim 1, wherein at least side surfaces of the first semiconductor layer and of the second semiconductor layer are covered by an oxidized semiconductor film.

6. A method for manufacturing a top-gate thin film transistor, comprising:
   a step of forming a source electrode and a drain electrode on an insulated substrate;
   a step of forming a first and a second impurity-doped semiconductor layers containing one of a first and a second electrically conductive impurities and electrically connected to the source electrode and drain electrode respectively;
   a step of forming a first semiconductor layer including microcrystalline semiconductor regions and an amorphous semiconductor region covering at least the first and the second impurity-doped semiconductor layers;
   a step of forming a second semiconductor layer of a microcrystalline semiconductor on the first semiconductor layer; and
   a step of forming a gate insulation film on the second semiconductor layer;
   wherein the step of forming the first semiconductor layer includes:
   a process of growing a microcrystalline semiconductor region having a same crystal structure as of the first and the second impurity-doped semiconductor layers on each of the first and the second impurity-doped semiconductor layers; and growing an amorphous semiconductor region on the source electrode and on the drain electrode.

7. The method for manufacturing the thin film transistor according to claim 6, further comprising:
   a step of consecutively etching at least the gate insulation film and the first and the second semiconductor layers; and
   a step of oxidizing etched side surfaces of the first and the second semiconductor layers after the etching of the first semiconductor layer.

* * * * *